(12) United States Patent
Alexander

(10) Patent No.: US 6,697,754 B1
(45) Date of Patent: Feb. 24, 2004

(54) GENERATION AND EXECUTION OF INSTRUMENT CONTROL MACRO FILES FOR CONTROLLING A SIGNAL MEASUREMENT SYSTEM

(75) Inventor: Jay A. Alexander, Monument, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 665 days.

(21) Appl. No.: 09/634,160

(22) Filed: Aug. 9, 2000

(51) Int. Cl.[7] .............................................. G06F 15/60

(52) U.S. Cl. ......................... 702/119; 702/13; 702/123

(58) Field of Search ............................ 702/119, 53, 64, 702/65, 67, 123, 80, 84, 118, 124, 126, 183, 188, 198

(56) References Cited

U.S. PATENT DOCUMENTS

| 5,001,714 | A | * | 3/1991 | Stark et al. .................. 714/737 |
| 5,155,836 | A | * | 10/1992 | Jordan et al. .................. 703/23 |
| 6,437,805 | B1 | * | 8/2002 | Sojoodi et al. ............. 345/763 |
| 6,577,981 | B1 | * | 6/2003 | Grey et al. .................. 702/119 |
| 6,584,601 | B1 | * | 6/2003 | Kodosky et al. ............... 716/4 |

\* cited by examiner

*Primary Examiner*—Marc S. Hoff
*Assistant Examiner*—Edward Raymond

(57) ABSTRACT

An apparatus and method for providing an end-user operator with the ability to assign temporary control of a set of one or more operator-specified instrument control operations to one, single-action switch on a signal measurement system front panel. The assigned instrument control operations are preferably represented by text strings in a macro text file that is developed and modified with the use of a text editor integrated into or operatively coupled with the signal measurement system.

29 Claims, 17 Drawing Sheets

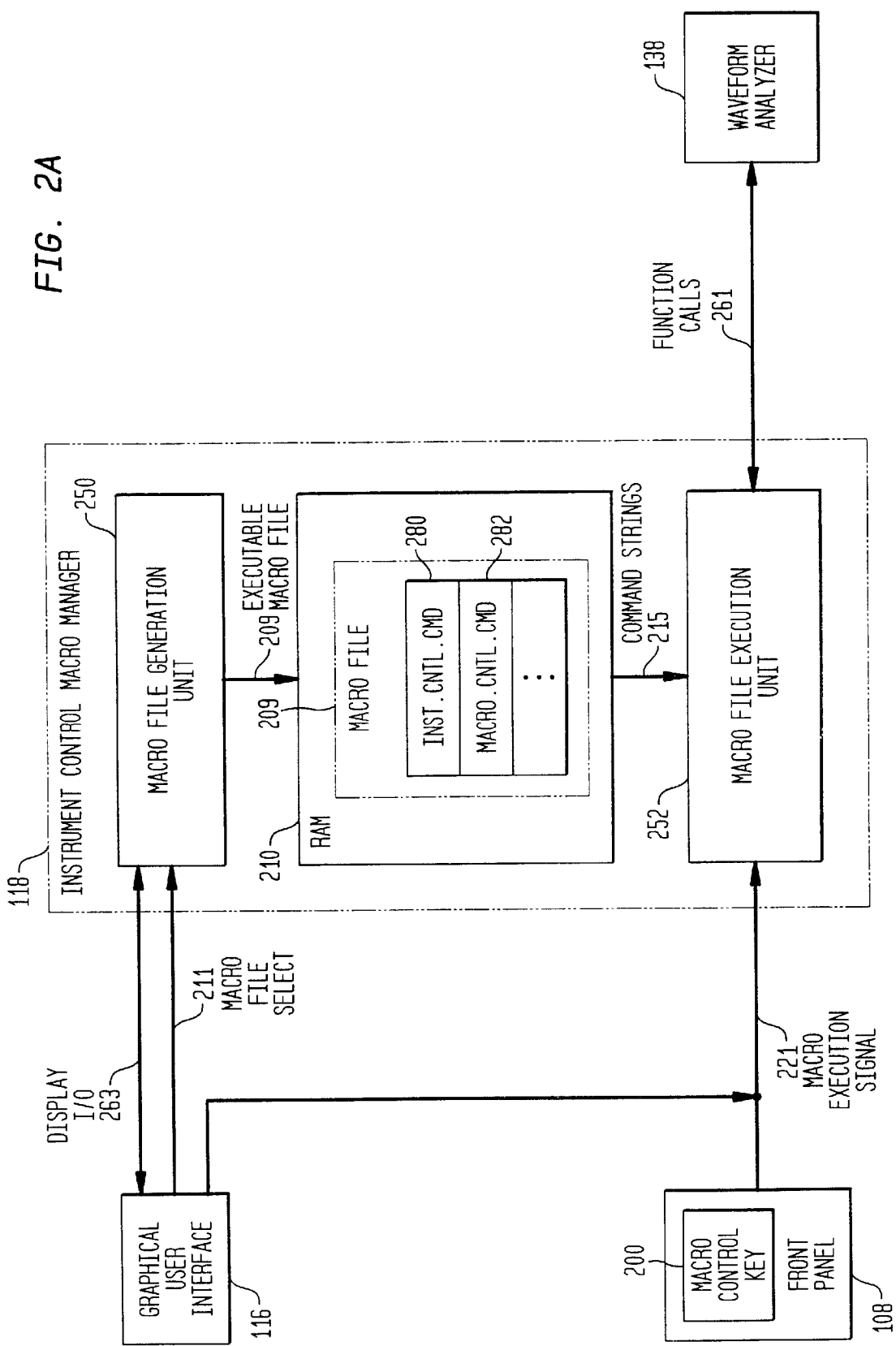

FIG. 2D
COMMAND DATA STRUCTURE 220
| GPIB COMMAND STRING (260) | COMMON SYNONYMS (262) | DIGITAL OSCILLOSCOPE FUNCTIONALITY (264) | FUNCTIONAL GROUPINGS (266) |
|---|---|---|---|
| | | | |
| | | | |
| | | | |
| | | | |
| | | | |
200
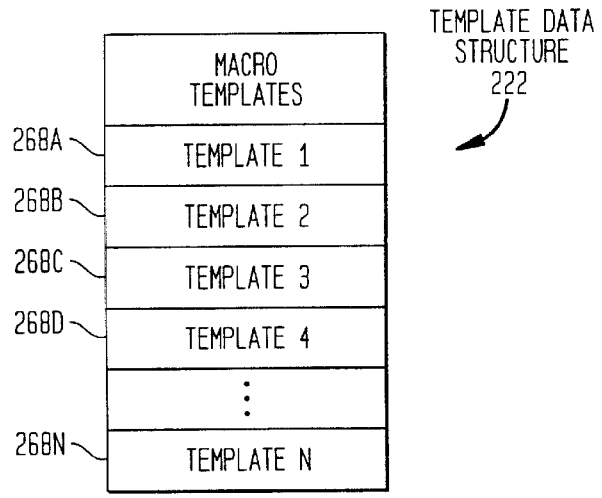
FIG. 2E
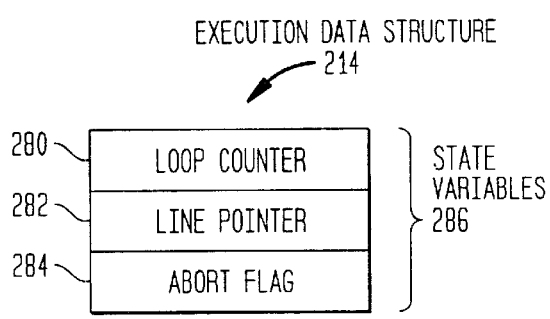
FIG. 2F

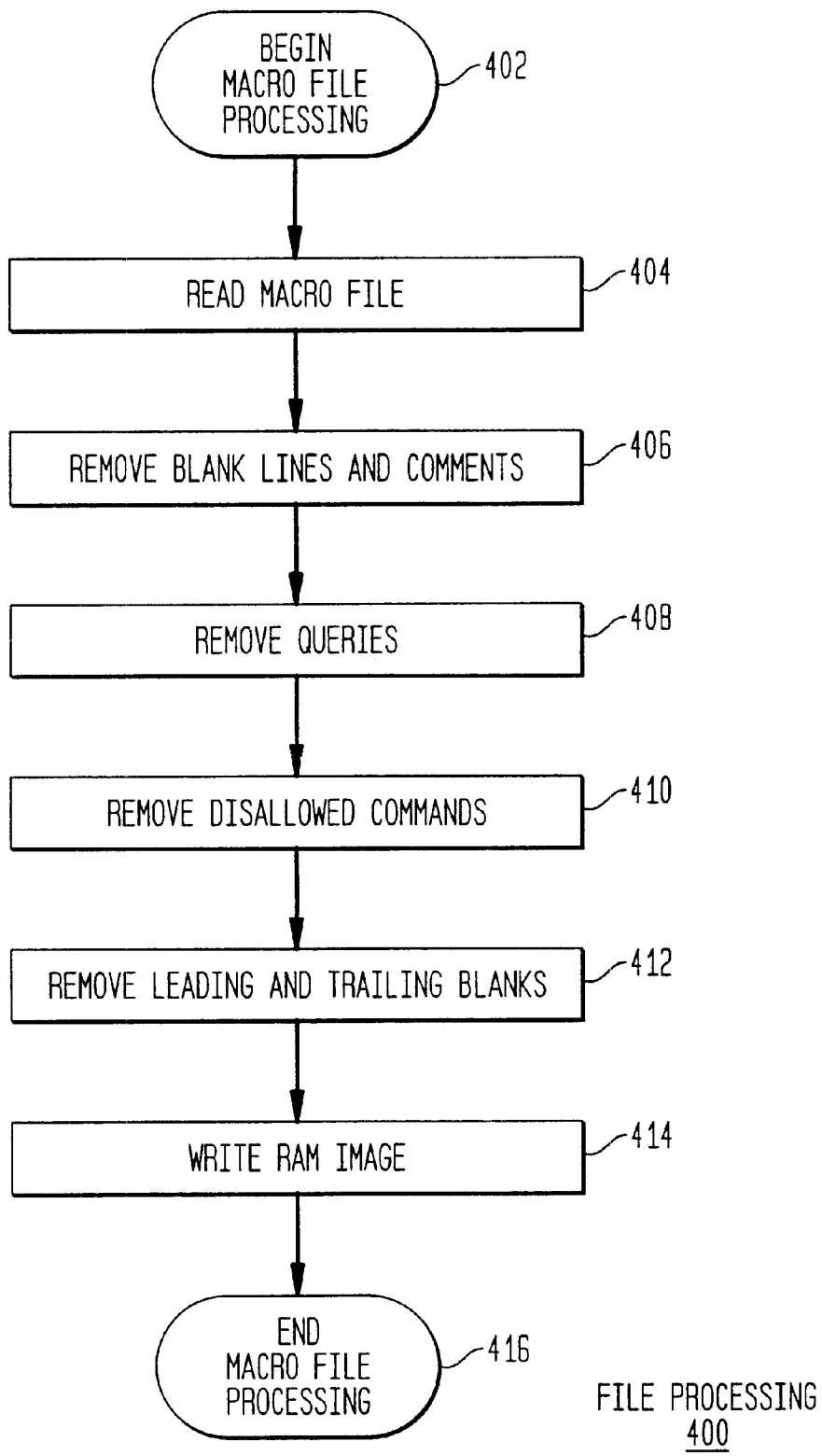

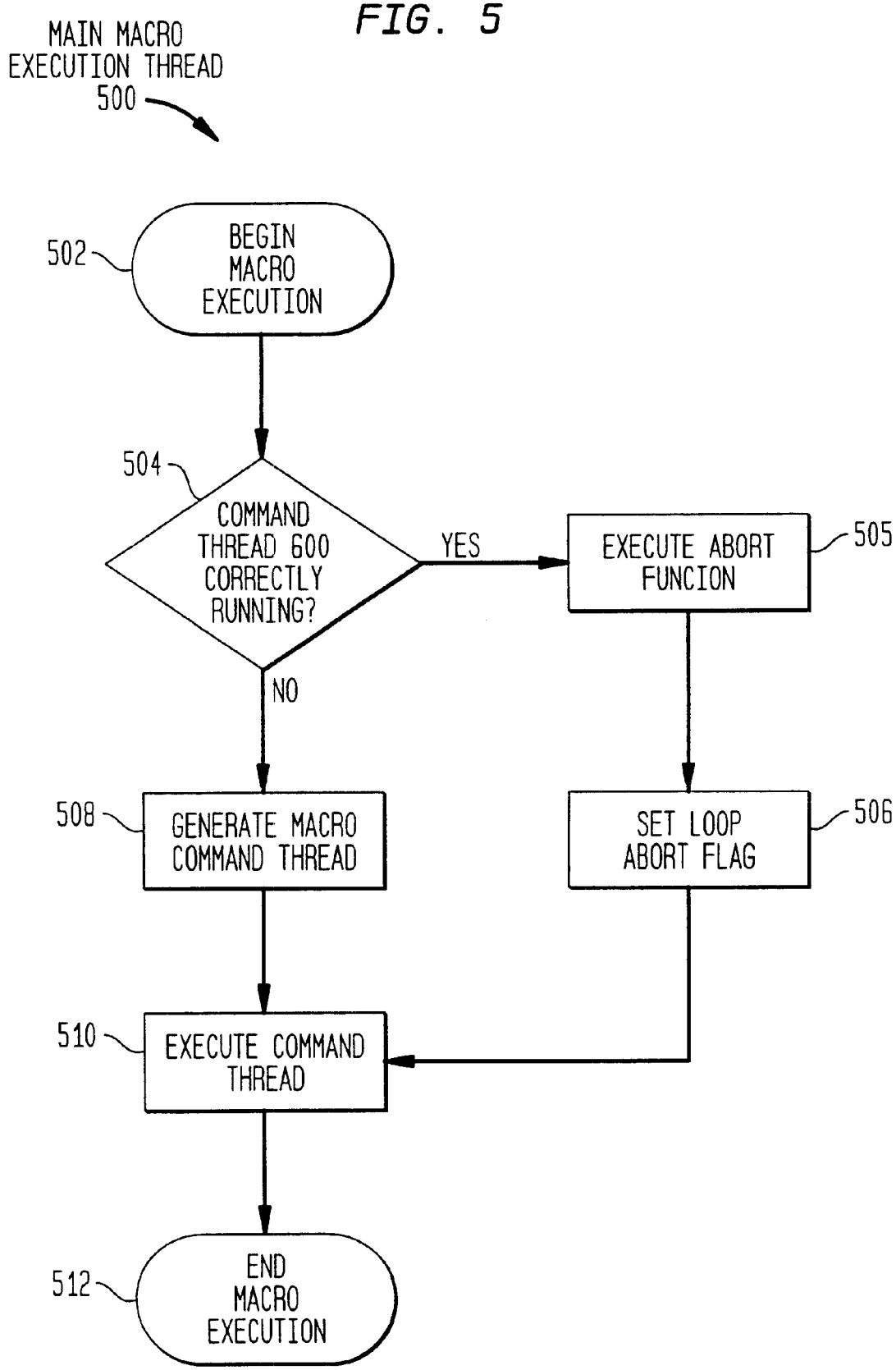

GENERATION AND EXECUTION OF INSTRUMENT CONTROL MACRO FILES FOR CONTROLLING A SIGNAL MEASUREMENT SYSTEM

BACKGROUND OF THE INVENTION

1. Field of the Invention

The present invention is directed generally to signal measurement systems and, more particularly, to the generation and execution of an instrument control macro file for controlling a signal measurement system.

2. Related Art

Conventional signal measurement systems such as digital oscilloscopes sample, record and display time-varying analog signals. Samples of an input signal are taken and quantified, and the resultant digital representations are stored in a waveform memory under the control of a sampling clock. The acquired data may be subsequently retrieved as locations in memory to provide digital data that can be converted to a time-varying output signal for a waveform display. The sampling clock may be operated at one of several selectable rates depending on the frequency content of the input signal. The portion of the analog input signal that is sampled and stored is determined by appropriate triggering circuitry to enable the operator to display the desired portion of the waveform.

There are many types of display elements that can be presented on a display device of signal measurement systems in general and test and measurement instruments in particular. For example, in addition to the waveforms representing the signals received at the channel inputs, waveforms referred to as function waveforms may also be displayed. Function waveforms are waveforms generated by processing one or more signal waveforms. Such processing may include, for example, performing arithmetic manipulations on a signal waveform or combining multiple input signal waveforms in some predetermined manner. The resulting function waveforms are stored in a display memory for subsequent retrieval and display. In addition, waveforms referred to as memory waveforms may also be displayed. Memory waveforms are waveforms that have been captured previously and stored in a memory device of the signal measurement system. In addition to the above waveforms, other display elements such as marker indicators, trigger indicators, etc., are typically displayed.

Modern signal measurement systems offer a significant number of instrument control operations that can be invoked by an operator to acquire and measure the displayed waveforms. Because instrument front panels are relatively small, these instruments cannot provide a dedicated front panel control for each available operation. To provide the operator with access to the available operations, conventional instruments generally include a hierarchical arrangement of multifunction softkeys. The instrument manufacturer assigns a limited number of common operations to dedicated front panel keys while assigning each of the remaining operations to a softkey in the softkey hierarchy.

Invocation of a desired operation that is not mapped to a dedicated front panel key requires the operator to navigate through one or more hierarchical softkey layers to reach the appropriate hierarchical layer that includes the desired operation. The operator then must activate the actual softkey associated with the desired operation. Unfortunately, this conventional approach fails to provide the operator with a simple and convenient technique to invoke frequently performed operations without numerous operator actions. For example, most digital oscilloscopes have a dedicated key for invoking run/stop functionality due to its widespread use across many different measurement scenarios. In contrast, there are no known oscilloscopes that have a dedicated front panel key to invoke, for example, the waveform averaging function. Also, the most commonly accessed functions vary not only from operator to operator but also for a given operator across different measurement scenarios. The permanent assignment of the front panel keys to a particular operation without regard to variability in individual operators or the tasks performed by a given operator often results in the operator not having immediate and direct access to desired operations. Not only are such arrangements difficult to understand and operate, considerable time is consumed performing the requisite steps to invoke a desired operation.

Similar drawbacks exist in signal measurement systems that provide the operator with a graphical user interface (GUI) through which instrument control operations can be invoked. In these systems, numerous point and click operations must be performed to invoke a desired operation. For example, GUI-based instruments typically require the operator to select a menu item from the main menu bar to cause the display of a relevant dialog box. Oftentimes, the operator must make graphical selections in this dialog box to cause an additional dialog box to be displayed. Having navigated through one or more dialog boxes, the operator must then graphically manipulate the information in the dialog box to invoke the desired operation. Finally, the operator must close the dialog box(es). Like the softkey approach, this requires a significant number of operator actions to be performed, consuming considerable operator time.

It is not uncommon for the operator to control the instrument to perform complex acquisition or measurement operations that require the sequential invocation of many individual instrument control operations. With the invocation of each such operation requiring the noted series of operator actions, it is often time consuming and difficult to perform the larger, more complex task using conventional instruments.

What is needed, therefore, is a system and method that enables the operator to quickly and easily invoke desired instrument control operations in a signal measurement system.

SUMMARY OF THE INVENTION

The present invention is directed to an apparatus and method for providing an end-user; that is, an operator, with the ability to invoke a set of one or more operator-specified instrument control operations with one, single-action switch preferably located on a signal measurement system front panel. Providing the operator with the capability to assign temporarily one or more instrument control operations to a single front panel switch or key to which the operator has easy and direct access enables the operator to customize the user interface to optimally support the operator's current needs. As the operator's needs and use of the signal measurement system change, so too can the instrument control operations that are mapped to the dedicated front panel key. Furthermore, any number and sequence of arbitrary instrument control commands may be included in the macro file, thereby providing significant flexibility in the development of macro files that can support the needs of the operator.

A number of aspects of the invention are summarized below, along with different embodiments that may be implemented for each of the summarized aspects. It should be understood that the embodiments are not necessarily inclusive or exclusive of each other and may be combined in any manner that is non-conflicting and otherwise possible. It should also be understood that these summarized aspects of the invention are exemplary only and are considered to be non-limiting.

In one aspect of the invention, a macro management system is disclosed. The macro management system provides an operator of a signal measurement system with the capability to invoke execution of an operator-defined executable macro file comprising one or more instrument control commands through a single operator action. Each instrument control command represents one or more instrument control operations. The single operator action is preferably an activation of a macro control key on a front panel of the signal measurement system, or graphical selection of a single display element presented on a graphical user interface of the signal measurement system. In one embodiment, the one or more instrument control commands are descriptive, high level commands of an instrument control language such as GPIB.

In one embodiment, the macro management system includes a macro file generation unit configured to provide the operator with a capability to develop, store and edit one or more macro text files comprising text strings. Such text strings include at least one instrument control command. The generation unit includes a text editor configured to operate with a graphical user interface to provide a text file editing environment with which the operator can develop one or more macro text files. Preferably, the text editor utilizes a graphical user interface to provide the operator with a graphical display of command names from which the operator can select the desired instrument control command for inclusion in the macro text file. The generation unit may also include a file processor to process the macro text file to generate the executable macro file.

The macro management system comprises a macro file execution unit configured to execute the executable macro file. The execution is initiated in response to receipt of a single macro execution signal generated in response to the noted single operator action. As each instrument control command is executed, the execution unit generates one or more function calls that causes the signal measurement system to perform operations associated with the executed instrument control command.

In addition, in certain embodiments, the command strings also include one or more macro control commands for controlling execution of the executable macro file. For example, the macro control commands includes a step command that, when executed by the execution unit, causes the macro file execution unit to halt execution of the executable macro file until a next macro execution signal is received. The macro control commands may also include, for example, a loop command that causes the execution unit to execute one or more command strings repeatedly for a specified number of iterations.

In one embodiment, the macro file execution unit includes a command processor that processes instrument control commands to generate formatted commands that are converted by a GPIB parser to system function calls. Preferably, a file viewer causes the display of the executable macro file along with a visual indication of which command string of the executable macro file is currently being executed by the execution unit.

In another aspect of the invention an apparatus for use in a signal measurement system is disclosed. The apparatus enables an operator to assign temporarily one or more instrument control operations to a single front panel switch to which the operator has easy and direct access.

In a further aspect of the invention a method for executing an operator-defined executable macro file comprising one or more instrument control commands in a signal measurement system is disclosed. The method comprises the steps of: (a) providing a macro text file comprising one or more text strings of which at least one is an instrument control command; (b) processing the macro text file to form an executable macro file; and (c) executing the executable macro file in response to activation of a macro control key on a front panel of the signal measurement system.

In one embodiment, step (a) includes the steps of: (1) providing a text editor to provide a text file editing environment on a graphical user interface of the signal measurement system; and (2) receiving operator inputs to develop or modify a macro text file. In another embodiment, step (b) includes the steps of: (1) removing blank lines from the macro text file; (2) removing disallowed commands from the macro text file; and (3) removing leading and trailing blank characters from the macro text file. Preferably, the macro text file is one of a plurality of macro text files, and step (a) further includes the step of: (3) retrieving a selected macro text file from the plurality of macro text files stored in memory in response to a macro selection command.

In a still further embodiment of this aspect, the text strings further include one or more macro control commands for controlling execution of the macro file. In this embodiment, step (c) comprises the steps of: (1) executing the instrument control commands in accordance with the macro control commands to generate formatted commands; and (2) converting the formatted commands to signal measurement system function calls; and, preferably, (3) generating of a display of the executable macro file with a visual indication of which command string of the executable macro file is currently being executed by the execution unit.

Various embodiments of the present invention provide certain advantages and overcome certain drawbacks of the above and other conventional techniques. Not all embodiments of the present invention share the same advantages and those that do may not share them under the same or similar circumstances. Thus, the following advantages may apply to one or more aspects and embodiments of the invention.

In contrast to conventional softkey-based instruments, the present invention eliminates the noted problem of having to navigate through the hierarchy of softkey menus in search of the softkey corresponding with each desired instrument control operation. Providing direct, front panel control significantly eliminates the time and frustration associated with having to recall, navigate to, and press numerous softkeys to activate the desired series of operations. The present invention provides similar benefits over conventional GUI-based instruments. In addition to the drastic reduction in the number of requisite operator actions to invoke an instrument operation, there are also advantages associated with the use of a single macro control switch. Mapping a macro file to a single, directly accessible key enables the operator to develop speed and accuracy by always reaching for the same key in the same location on the front panel. Thus, the control mapping feature of the present invention enables an operator of a signal measurement system to drastically increase productivity as compared to conventional instruments.

Those aspects of the invention in which the instrument control operations are represented by high-level, descriptive commands of an instrument control language provide additional advantages. Use of such a descriptive instrument control language requires minimal operator knowledge of a programming language to utilize the invention due to the ease with which the descriptive text commands can be recognized. This is particularly true in cases in which the instrument control language is GPIB due to its prevalence in instrument remote control. This is in contrast to conventional instruments that require the operator to implement a software program that generates instrument control commands. Such a program executes on an external controller, typically a personal computer, connected to the conventional instrument via cables. The controller is configured to invoke program action when a certain key on the controller keyboard is pressed.

Such a conventional approach requires the combined system to be configured, including the integration of interface cards, cables, driver libraries, etc. Further, accessing the operation from a controller keyboard is often inconvenient due to the inability to locate the keyboard in close proximity to the instrument front panel. In certain situations such as field service it may not be possible for the operator to transport and setup both the instrument and external controller.

By eliminating the programming environment and providing the operator with the ability to directly utilize descriptive instrument control commands, the present invention provides the operator with an elementary level of automation control without the use of other equipment such as an external controller, and without requiring the operator to have a working knowledge of the specific syntax and structure of a programming language. This not only saves substantial time but enables the instrument to be transported to and used in more restrictive environments than conventional instruments. Further, the present invention also eliminates the significant overhead consumed in the development, test and verification of such automation test programs.

In addition, unlike such programs, instrument control commands do not have to be compiled and linked to be executed. Instead, the instrument control commands are interpreted individually; that is, they can be individually converted to function calls that, when applied to the signal measurement system, cause the signal measurement system to perform the operation represented by the instrument control command. As such, in certain embodiments, instrument control commands can be applied to the signal measurement system individually so that the operator can determine the effect of the command on the instrument before utilizing it in a macro file.

These are just a few of the notable advantages provided by the present invention. Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 2A is a high-level functional block diagram of one embodiment of the instrument control macro manager illustrated in FIG. 1.

FIGS. 2D–2F are a schematic diagrams of a data structures utilized in one embodiment of the instrument control macro manager illustrated in FIG. 1.

FIG. 4 is a flow chart of the primary processes performed by one embodiment of the present invention to generate an executable macro file containing one or more executable command strings.

FIG. 5 is one embodiment of a main macro execution process performed in accordance with one embodiment of the present invention.

DETAILED DESCRIPTION

I. System Environment

Figure 1:
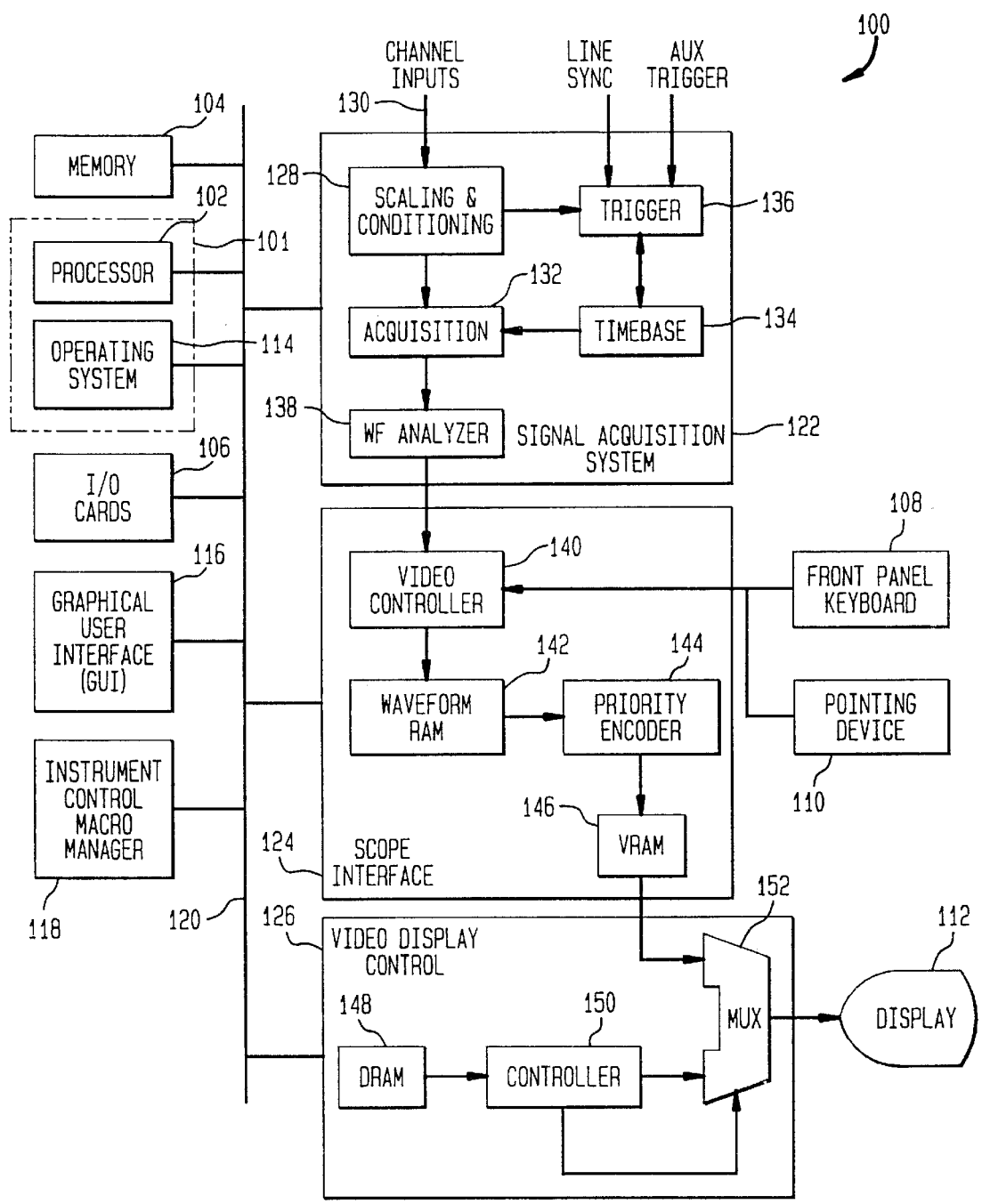
FIG. 1 is a functional block diagram of a digital oscilloscope suitable for implementing the instrument control macro management system and methodology of the present invention.

The present invention, hereafter referred to as a instrument control macro management system or, simply, macro manager, may be implemented in any signal measurement system now or later developed. In one embodiment of the present invention, the macro manager is implemented in a test and measurement instrument, such as a digital or analog oscilloscope, logic analyzer, network analyzer or spectrum analyzer. FIG. 1 is a functional block diagram of an exemplary digital oscilloscope suitable for implementing the instrument control macro manager of the present invention.

Digital oscilloscope 100 is a commonly-available digital oscilloscope designed to acquire, analyze and display a wide variety of signals generally in terms of the voltage of the signals versus time. Digital oscilloscope 100 preferably includes a general purpose computer system which is programmable using a high level computer programming language, and specially-programmed, special purpose hardware for performing signal acquisition, analysis and display functions.

Digital oscilloscope 100 includes a processor 102, a memory unit 104, input/output (I/O) interface cards 106, storage units (not shown) such as a hard disk drive and a floppy disk drive, display 112, and one or more input devices such as front keyboard panel 108 and pointing devices 110. Memory 104 is used for storage of program instructions and for storage of results of calculations performed by processor 102. In a preferred embodiment, memory 104 includes random access memory (RAM). The display is preferably a liquid crystal display and is logically or physically divided into an array of picture elements (pixels). Input/output (I/O) interface cards 106 may be modem cards, network interface cards, sound cards, etc.

Processor 102 is typically a commercially available processor, such as the Pentium microprocessor from Intel Corporation, PowerPC microprocessor, SPARC processor, PA-RISC processor or 68000 series microprocessor. Many other processors may also be used. Such a processor usually executes a program referred to as an operating system 114, such as the various versions of the Windows operating systems from Microsoft Corporation, the NetWare operating system available from Novell, Inc., or the Unix operating system available from many vendors such as Sun Microsystems, Inc., Hewlett-Packard Company and AT&T. Operating system 114 controls the execution of other computer programs such as a graphical user interface (GUI) 116 and the instrument control macro manager 118 of the present invention, and provides scheduling, input-output control, file and data management, memory management, and communication control and related services. Processor 102 and operating system 114 define a computer platform shown by dashes block 101, for which application programs in high level programming languages are written. The functional elements of the digital oscilloscope 100 communicate with each other via bus 120.

Digital oscilloscope 100 includes a signal acquisition system 122, a scope interface 124 and video controller 126. Signal acquisition system 122 includes scaling and conditioning 128 that receives input signals through channel inputs 130. Scaling and conditioning unit 128 and acquisition unit 132 include well-known high frequency electronics for signal acquisition, signal conditioning, and analog-to-digital conversion, all of which are controlled by computer system 101 and are considered to be well-known in the art. Timebase 134 drives the analog-to-digital conversion process performed in acquisition 132, specifying when to sample the input signals and how many samples are to be taken. Trigger 136 synchronizes the acquisition process through timebase 134, enabling an operator to arrange a trigger event to obtain a stable waveform display of the desired features of one or more of the input signals. Trigger 136 may be based upon a line sync or auxiliary trigger input, as is well known in the art.

Waveform analyzer 138 performs measurement processes for developing the waveform for display. It contains hardware and software to perform well-known operations such as setting the analog-to-digital codes for acquisition unit 132 and mapping the resulting digital information to the physical pixel locations which are ultimately presented on display 112 under the control of GUI 116. Pointing device 110 and/or the keyboard 108 are used to move a cursor on GUI-controlled display 112 to select display elements under the cursor. Pointing devices 110 may include any number of pointing devices such as a mouse, trackball or joy stick. Of course, the cursor may be controlled with one or more keyboards 108 located externally or integrated into a front panel of digital oscilloscope 100.

Scope interface card 124 includes a video controller 140 that controls the rendering of pixels into the waveform random access memory (RAM) 142. It also receives display element control commands and cursor input information from the front panel keyboard 108 and the pointing device(s) 110. Waveform RAM 142 includes a data structure for each pixel location on display 112. The data structures contain information regarding every display element that is to be drawn at each pixel location. Although there may be multiple display elements which are to be drawn at a given pixel location, only one color may be rendered at that location. Waveform RAM 142 supplies the priority encoder 144 with this information. Priority encoder 144 prioritizes the competing display elements. For example, if an operator arranged a marker and a waveform such that they are located in the same pixel location, then priority encoder 144 selects that display element with a highest predetermined priority. In such an example, the color of the marker is rendered at the pixel location providing a display that appears to show the marker over the waveform. Priority encoder 144 then sends the selected color to VRAM 146 which then causes the pixel to be rendered in the indicated color.

Video display controller 126 includes a dynamic random access memory (DRAM) 148 which contains data specifing a color for each pixel in the display 112. Likewise, video random access memory (VRAM) 146 also contains data specifing a color for each pixel in display 112. Computer system 101 controls the information in DRAM 148 while signal acquisition system 122 controls information in VRAM 146. For each pixel in display 112, video controller 126 selects whether the pixel in display 112 is specified from VRAM 146 or DRAM 148. In general, information in VRAM 146 includes digitized waveforms being generated by system 122 with high rates of change that are much too fast for software processing by computer system 101 for real-time display of the waveforms on display 112.

Video controller 126 includes a controller 150 and a multiplexer 152. Controller 150 controls which of the two inputs to multiplexer 152 are processed into display signals for transmission to display 112 under the control of graphical user interface 116. Controller 150 typically monitors color data sent from DRAM 148 and may be programmed to switch multiplexer 152 to a different input when a particular programmed color is received from the DRAM 148. A rectangular pixel area is typically defined within DRAM 148 with the programmed color, typically dark gray. The programmed color is not displayed, but instead serves as a data path switch control for multiplexer 152. Therefore, within the programmed color rectangle, display data comes from VRAM 146. When various control functions are needed, an interactive dialog box is drawn within the programmed color rectangle.

Macro management system 118 is a simple and intuitive apparatus and associated methodology that provides an operator of a signal measurement system with the capability to develop macro files that are executed in response to a single invocation command. Bach such macro file contains one or more operator-selected instrument control commands, each representing one or more instrument control operations. The operator may specify any number and sequence of arbitrary instrument control commands to achieve a desired operational objective. Preferably, the invocation command is generated in response to the activation of a single button, toggle switch or the like (herein "macro control key") located on front panel 108 of signal measurement system 100. Stated differently, the present invention enables an operator to assign temporarily control of a macro file of one or more instrument control commands to a single front panel key to which the operator has easy and direct access. Thus, the present invention advantageously provides an operator with the ability to customize the user interface of signal measurement system 100 to optimally support the current and future needs of the operator, forming macro files that are implemented with minimal operator involvement.

In accordance with certain aspects of the present invention, the instrument control commands that comprise each macro file are represented by descriptive, high level commands of an instrument control language such as GPIB. This requires that the operator have little or no knowledge of a programming language to utilize the invention due to the descriptive text commands that are identical in form and behavior to those used in conventional remote control context, and which are described in existing product documentation. This also relieves the operator from having a working knowledge of the specific syntax and structure of a particular programming language, and eliminates the drawbacks associated with the use of an external controller.

Also, signal measurement systems commonly implement a GPIB interface to provide for remote control of the instrument. Should oscilloscope 100 have such an interface, then oscilloscope 100 also includes a GPIB parser. The present invention utilizes the existing GPIB parser to decode and interpret GPIB commands generated by the present invention, converting them into function calls appropriate for controlling digital oscilloscope 100.

Another advantage of using an instrument control language is that the macro file can be decoded by an interpreter. This eliminates the need for the operator to spend the time necessary to develop a software program that generates the requisite instrument control commands. Also, instrument control commands do not have to be compiled and linked in order to be executed. Instead, the instrument control commands can be interpreted individually; that is, they can be individually converted to function calls that, when applied to the signal measurement system, cause the signal measurement system to perform the operation(s) represented by the instrument control command. As such, in certain embodiments, instrument control commands can be applied to the signal measurement system individually so that the operator can determine the effect of the instrument control command on the signal measurement system before utilizing it in a macro file.

In one embodiment, macro manager 118 is implemented in software routines which inter-operate with the components of signal measurement system 100 to perform the macro file development and execution functions in accordance with the present invention. Such software routines typically reside in memory 104 and/or disk storage devices, and may be stored on any other computer-readable medium such as, for example, magnetic disk, compact disc or magnetic tape, and may be loaded into digital oscilloscope 100 using an appropriate peripheral device as known in the art. Preferably, this embodiment of macro manager 118 is implemented in any well-known functional or object-oriented programming language such as C or C++. Those skilled in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. The macro manager system may be implemented, for example, in dedicated hardware, firmware, or any combination thereof.

Figure 2B:
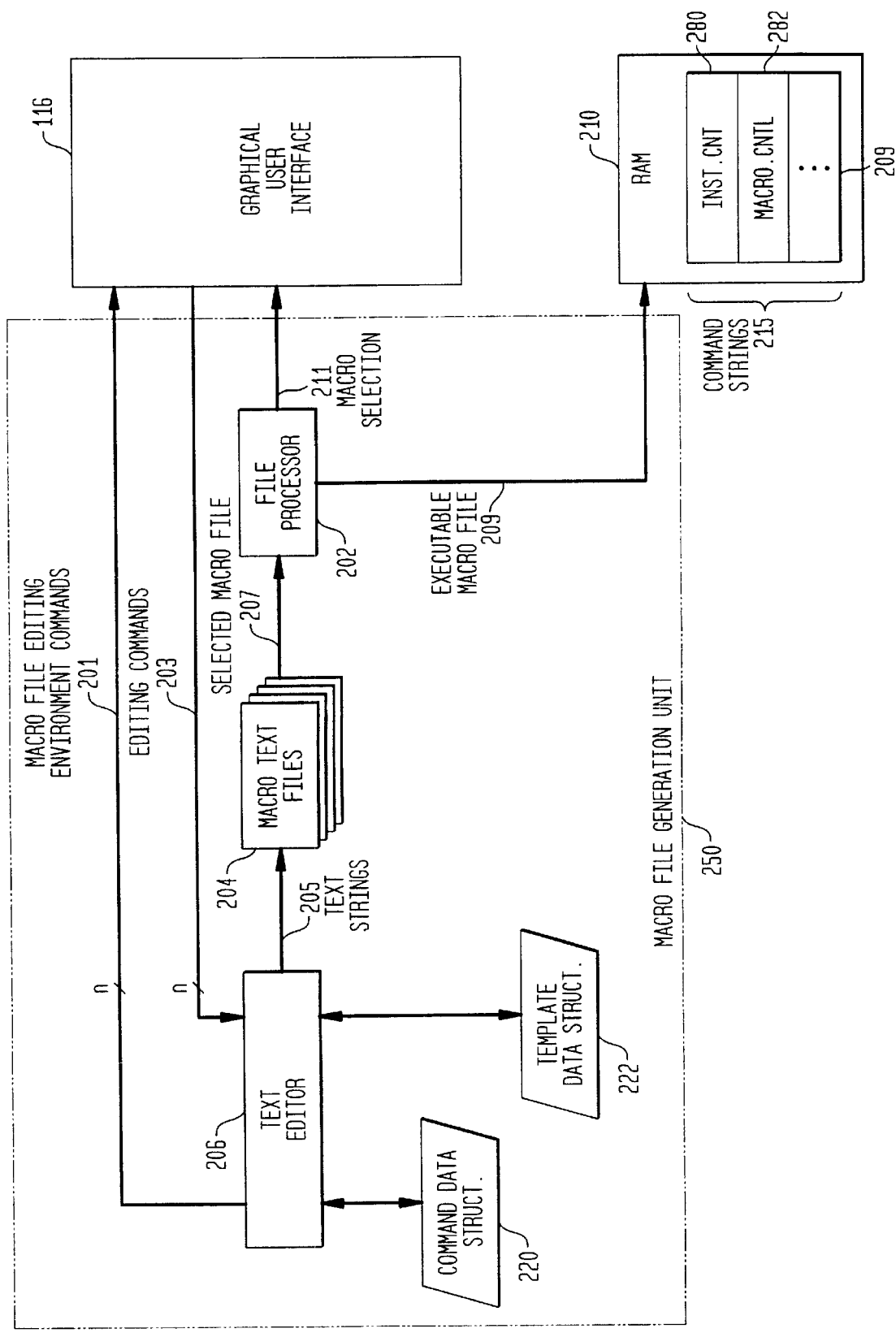
FIG. 2B is a detailed functional bock diagram of a macro file generation unit illustrated in FIG. 2A.

A preferred implementation of macro manager 118 is in test and measurement equipment having a control panel keyboard such as front panel 108, and/or a graphical user interface 116. A high-level functional block diagram of one preferred embodiment of macro manager 118 of the present invention implemented in digital oscilloscope 100 is shown in FIGS. 2A–2B. The data structures created and accessed by the illustrative embodiments of macro manager 118 are illustrated in detail in FIGS. 2C–2E. The function and operation of macro manager 118 will be described with reference to an exemplary measurement results display 300 illustrated in FIGS. 3A–3H which are displayed on display 112 using graphical user interface 116.

II. High-Level Functional Description
A. Macro Manager 118

FIG. 2A is a functional block diagram illustrating the primary components of one embodiment of instrument control macro manager 118. There are two main operations or processes performed by macro manager 118. The first, performed by a macro file generation unit 250, involves the development, storage, retrieval and editing of one or more macro text files that are used to form executable macro files 209 the execution of which controls the operation of signal measurement system 100. Executable macro file 209 is stored in RAM 210 for subsequent execution, and includes at least one or more instrument control commands 280. Macro files also may include macro control commands 282 for providing the operator with greater control over the execution of macro file 209. Together, instrument control commands 280 and macro control commands 282 comprise commands strings 215. Macro file generator 250 preferably provides a text-editing environment to facilitate the development of macro file 209. As such, display input/output signals 263 are exchanged between graphical user interface 116 and macro file generation unit 250 to provide a text editing environment in which the operator can create, retrieve, edit and store macro files.

The second primary operation, performed in this embodiment by a macro file execution unit 252, involves the execution of command strings 215 of macro file 209. The execution is preferably initiated in response to the receipt of a single macro execution signal 221 generated in response to activation of a dedicated macro control key 200 on front panel 108. In alternative embodiments, activation of a dedicated display element on GUI 116 will also cause generation of macro execution signal 221.

Macro file execution unit 252 executes the one or more instrument control commands 280 in accordance with macro control commands 282, if any. Certain macro control commands 282 may require additional generation of macro execution signal 221; that is, additional activation of the dedicated macro control key 200. As each instrument control command 280 is executed, execution unit 252 generates one or more function calls 261 appropriate for causing signal measurement system 100 to perform the operations associated with the executed instrument control command 280. As shown in FIG. 2A, function calls 261 are provided to waveform analyzer 138 of digital oscilloscope 100.

Because the activation of macro control key 200 may signify any number of different control commands based on the current state of execution, the macro control commands that are utilized, etc., the signal generated by the activation of macro control key 200 is referred to herein as macro execution signal 221. For example, receipt of a macro execution signal 221 may signify that an executable macro file 209 should be executed, aborted or advanced beyond a step command.

The structure and operation of instrument control macro manager 118 will be described in detail below. Before that presentation, however, a description of the macro files that can be generated with the present invention will be presented.

B. Macro Files

As noted, macro files 209 include descriptive instrument control commands 280, and macro control commands 282 that have a syntax and format defined, preferably, by a high-level interpreted programming language. The use of descriptive, high-level commands provides significant benefits. Descriptive text commands are easy to understand and utilize productively, even for the novice operator. In one embodiment, the high-level command language satisfies ANSI/IEEE Standard 488.1-1987, IEEE Standard Digital Interface for Programmable Instrumentation and ANSI IEEE Standard 488.2-1992, IEEE Standard Codes, Formats, Protocols, and Common Commands. This command language is commonly referred to in the industry as GPIB. Implementation of the GPIB instrument control language is particularly beneficial because it is commonly used for remote control of instrumentation. As a result, there is a significant likelihood that an operator is familiar or even proficient in the use of this instrument control language. As such, the creation of a macro file with GPIB commands is expected to be quite easy for the experienced operator to utilize effectively. Other benefits noted above include the opportunity to utilize an existing GPIB parser, and the ability to execute command strings 215 individually.

As noted, aspects of the present invention enable an operator to assign temporarily the control of the execution of macro file 209 to a single front panel macro control key 200. To avoid limitations associated with a single control input approach while also providing the operator with the ability to control the execution of macro file 209 beyond its initiation, the execution state of macro file 209 is maintained by the present invention. In this way, activation of macro control key 200 can be interpreted in the context of the current operational state of signal measurement system 100. Also, as noted, a second type of command string 215 is included in executable macro file 209, referred to herein as macro control commands 282. Macro control commands 282 are provided in certain aspects of the present invention to provide basic execution control of macro file 209 itself, thereby enabling the operator to create more sophisticated macro files that are still controllable via a single execution signal.

There are two macro control commands included in the illustrative embodiment of the present invention. One macro control command is a "Step" command. A Step command causes the execution of macro file 209 to halt or pause until macro control button 200 is activated once again. Thus, the use of the Step command enables the operator to develop a macro file having a number of sections the execution of each being individually controllable by the operator. Another macro control command is the "Loop" command. The Loop command enables the operator to develop a macro file in which one or more command strings 215 can be repeated for a specified number of iterations.

To facilitate understanding of the various aspects and embodiments of the present invention, a number of macro file examples will now be described. The examples will be presented in a sequence of increasing complexity and will be limited to those that are of general application and understanding, and which use only the two noted macro control commands introduced above. Each command string 215 is preceded by a reference numeral to identify the command string.

1) EXAMPLE 1

Single Instrument Control Command

As a first example, we consider an operator requirement of loading repeatedly a specific instrument setup file before beginning each of a series of measurement operations. For example, the operator of an oscilloscope may be performing a large number of measurements and desires that the state of the oscilloscope be the same prior to each such measurement. As is well known, a setup file includes a series of low-level instrument settings, typically in a proprietary format, that defines the configuration of the oscilloscope.

Typically, loading such a setup file in conventional systems requires the operator to perform a number of operations to reset the oscilloscope to the desired configuration state prior to the performance of each measurement operation. For example, in a windows-based system, the operator may need to select menu items from a pull-down menu and dialog box display elements associated with recalling set-up files, followed by the operator invoking the loading operation. In a softkey-based instrument, the operator would need to activate numerous softkeys.

In accordance with the present invention, an executable macro file 209 such as macro file EX1 may be developed to perform this series of operations. This executable macro file includes a single GPIB command:
Macro file: EX1
   1: LoadSetup "c:\scope\setups\Start.set";
In accordance with one aspect of the invention, control of the execution of macro file EX1 is assigned to the dedicated front panel macro control key 200. Each time the operator presses macro control key 200, macro file EX1 is executed by macro file execution unit 252, causing the LoadSetup command to be performed. Thus, by activating a single switch 200 on front panel 108, a desired setup file is loaded into signal measurement system 100 and system 100 is thereafter configured as desired to perform the measurement. This is significantly more accurate, faster and more intuitive that the above-noted or other conventional approaches. Further, the next time the operator performs a measurement operation, the operator need only press the same macro control key 200 to re-configure oscilloscope 100, thereby compounding the benefits.

2) EXAMPLE 2

A Sequence of Instrument Commands

A second example expands on the first. Here, the operator requires that, after the initial setup file is implemented, the current signal that is being measured is autoscaled. The autoscale function is well known to those of ordinary skill in the art and, therefore, is not described further herein. The present invention enables the operator to create Macro file EX2 which includes two commands:
Macro file: EX2
   1 :LoadSetup "c:\scope\setups\Start.set";
   2 :Autoscale;
Each time the operator presses macro control key 200, macro file EX2 will be executed by macro file execution unit 252, causing the two commands to be performed. Thus, with the pressing of a single button, a desired setup file is loaded into signal measurement system 100 and the desired autoscale operation is performed. The operator activity required for this second macro example is essentially the same as that of the first. This is in contrast to conventional approaches in which invoking the additional operation can take significantly more time.

3) EXAMPLE 3

Use of the Step Command

As noted, one macro control command implemented in the disclosed embodiment is the Step command. Execution of a Step command causes macro file execution unit 252 to pause execution of the selected macro file until macro control key 200 is activated once again. There are many circumstances in which an operator may want to pause execution and to receive control over the execution. In this example, the step command is used by the operator to toggle the performance of a particular measurement function.

In this example, the operator desires to perform an averaging function on certain signals and not on others, or would like to alternate between the performance and non-performance of the averaging function on one while performing various measurement operations. Conventionally, numerous softkey layers or GUI control inputs must be accessed to implement the averaging function. For example, with regard to the GUI-based approach, the operator must select an item on the main menu bar to invoke an acquisition dialog box. The operator must then manipulate the averaging controls in the dialog box as desired. Then, the operator must close the dialog box to invoke the averaging function. This is because the limited use of the averaging function has been deemed to be insufficient to warrant a dedicated function key on the instrument front panel 108 or a location on a high functional softkey layer.

In contrast, the present invention enables the operator to develop a simple executable macro file 209 that is responsive to activation of macro control key 200 and which performs or does not perform the desired averaging function in response to an operator indication. Specifically, macro file EX3 includes the use of a step command to toggle the desired function to accommodate the operator's need to selectively and repeatedly invoke the function on different signals.

Macro file EX3:

1 :Acquire: Averaging Off;

2 STEP

3 :Acquire: Averaging On;

With a first activation of macro control key 200, macro file EX3 is executed and the averaging function is disabled with the execution of the first command string 215. Macro file execution unit 252 pauses the execution of macro file EX3 when it processes the second command string 215, Step. When doing so, macro file execution unit 252 retains the current location in macro file EX3. Upon receipt of an indication that the operator has activated again macro control key 200, macro file processor 252 processes the third command string 215, enabling the averaging function. Upon detection of the end of macro file EX3, macro file execution unit 252 ceases the execution of macro file EX3. Should the operator activate macro control key 200 a third time, macro file EX3 will be executed again, with the averaging function being disabled upon the execution of the first command string 215. Thus, with macro file EX3 the operator can, among other things, make a number of measurements and compare the measurements with averaging enabled and disabled. This example shows how easy it is to map any given on-off control to dedicated macro control key 200.

4) EXAMPLE 4

Multiple Command Strings per Step

The following example, EX4, illustrates the combination of multiple Step commands in a single executable macro file 209. It also illustrates the implementation of multiple command strings 215 in single, independently-controllable sections of executable macro file 209.

Macro file EX4:

1 :Acquire:Averaging Off;

2 STEP

3 :Acquire:Averaging On;

4 :Acquire:Averaging Count 16;

5 STEP

6 :Acquire:Averaging Count 64;

7 STEP

8 :Acquire:Averaging Count 256;

Macro file EX4 enables the operator to cycle through the performance of the averaging function with different numbers of acquisitions; that is, the operator can quickly characterize the same waveforms using various degrees of averaging to increasingly smooth out the effects of noise in the waveforms. The first activation of macro control key 200 starts execution of macro file EX4, executing the first command string and halting at the second. This turns the averaging function off. A second activation of key 200 causes the execution of the third and fourth command strings 215, halting again at the fifth. This turns the averaging function on, and requests that the averaging function be performed over 16 acquisitions. Subsequent macro key 200 activation cause the execution of macro file EX4 is a similar manner. Thus, an operator simply activates front panel macro control key 200 four times to step through the different averaging operations, with additional activations to repeat the cycle. This is a significant improvement as compared with perhaps a dozen point and click operations in a GUI-based instrument and at least as many softkey presses with a softkey-based product.

5) EXAMPLE 5

Elementary Automation

Macro file EX5 demonstrates the use of elementary automation. As noted, conventional instruments that provide any capability for an end-user to program or otherwise configure the instrument to perform measurement operations in an automated manner require the implementation of an external controller. The associated drawbacks of time to configure and program the external controller, as well as the restricted use of the integrated system were noted above.

However, there are many benefits associated with being able to cause signal measurement system 100 to perform operations without the immediate participation of the operator. For example, an operator may want to capture a rare event and automatically log the event in some way, such as by printing the screen image, storing the screen to a bitmap file, or storing the captured waveform to a spreadsheet file. Such a need may arise, for example, when a circuit under test behaves unpredictably. Should the operator be unable to capture the rare event automatically, there is a danger of losing the details of its occurrence or even the fact that it occurred at all. Macro file EX5 is one example of how such an operation can be performed with minimal operator time and effort.

When executed, macro file EX5 controls the oscilloscope to perform certain functions in response to the occurrence of certain conditions. Specifically, macro file EX5 enables the operator to place the oscilloscope into an automatic mode of operation where it waits to capture a rare event.

Macro file EX5:

1 :Trigger:Mode Single;

2 :Digitize;

3 :Printscreen;

The first two command strings 215 of macro file EX5 place oscilloscope 100 in the single trigger mode such that when the trigger event occurs, a single acquisition is performed. Upon the completion of the digitizing, the print screen command is executed, for example, to direct the screen image to the default printer. Macro file EX5, therefore, relieves the operator from having to monitor the signal for the unpredictable trigger event. Instead, the operator simply generates macro file EX5, which is simple and easily to create and, when the functionality is desired, simply press the macro control key 200 on the front panel 108. This provides a significant savings in operator time and effort as compared with conventional approaches that require either sophisticated programming systems or continual operator attention.

6) EXAMPLE 6
Use of the Loop Command

As another example, in digital oscilloscopes with access to mass storage devices, operators sometimes desire to capture a series of acquisitions and automatically stream them to disk using an incremented file naming convention. As noted, one macro control command implemented in the disclosed embodiment is the Loop command. Execution of a Loop command causes macro file execution unit 252 to repeatedly execute certain command strings 215 for a specified number of iterations. Macro file example EX6 is a demonstration of the use of the Loop command.

Macro file EX6:
1 :Trigger:Mode Triggered;
2 :Digitize;
3 Disk:SaveWaveform Channell, "c:\scope\data\Stream%d.csv",CSV;
4 LOOP 100

The first two command strings 215 of macro file EX6 are similar to those discussed above with reference to macro file EX5. The fourth command string 215 is a LOOP command which causes the associated first three command strings to be executed 100 times when macro control key 200 is activated.

The third command string 215 causes the channel 1 data for each acquisition to be stored to a series of spreadsheet files with the common ".csv" extension. The "%d" portion of the SaveWaveform command is replaced with the loop number of each iteration. Thus, the names of the files are Stream1.csv, Stream2,csv, . . . Stream100.csv. Thus, macro file EX6 acquires 100 triggered acquisitions of channel 1 data and stores each in a separate file.

It should be understood that the above examples are but a very limited sample of the type of executable macro files that can be implemented by the present invention. There is an almost unlimited number of macro files that can be created due to the breadth of available instrument control commands and the availability of macro execution commands, particularly given that any number and combination of such command strings can may be included in a single macro file.

There are numerous approaches to implementing macro management system 118. A functional description of one such exemplary implementation is described below with reference to FIGS. 2B and 2C. It should be understood, however, that the present invention may be implemented in any combination of hardware or software and may have any functional distribution consistent with the claimed invention. The following example is just one such example which may be implemented in digital oscilloscope 100 illustrated in FIG. 1.

III. Detailed Functional Description

Figure 2C:
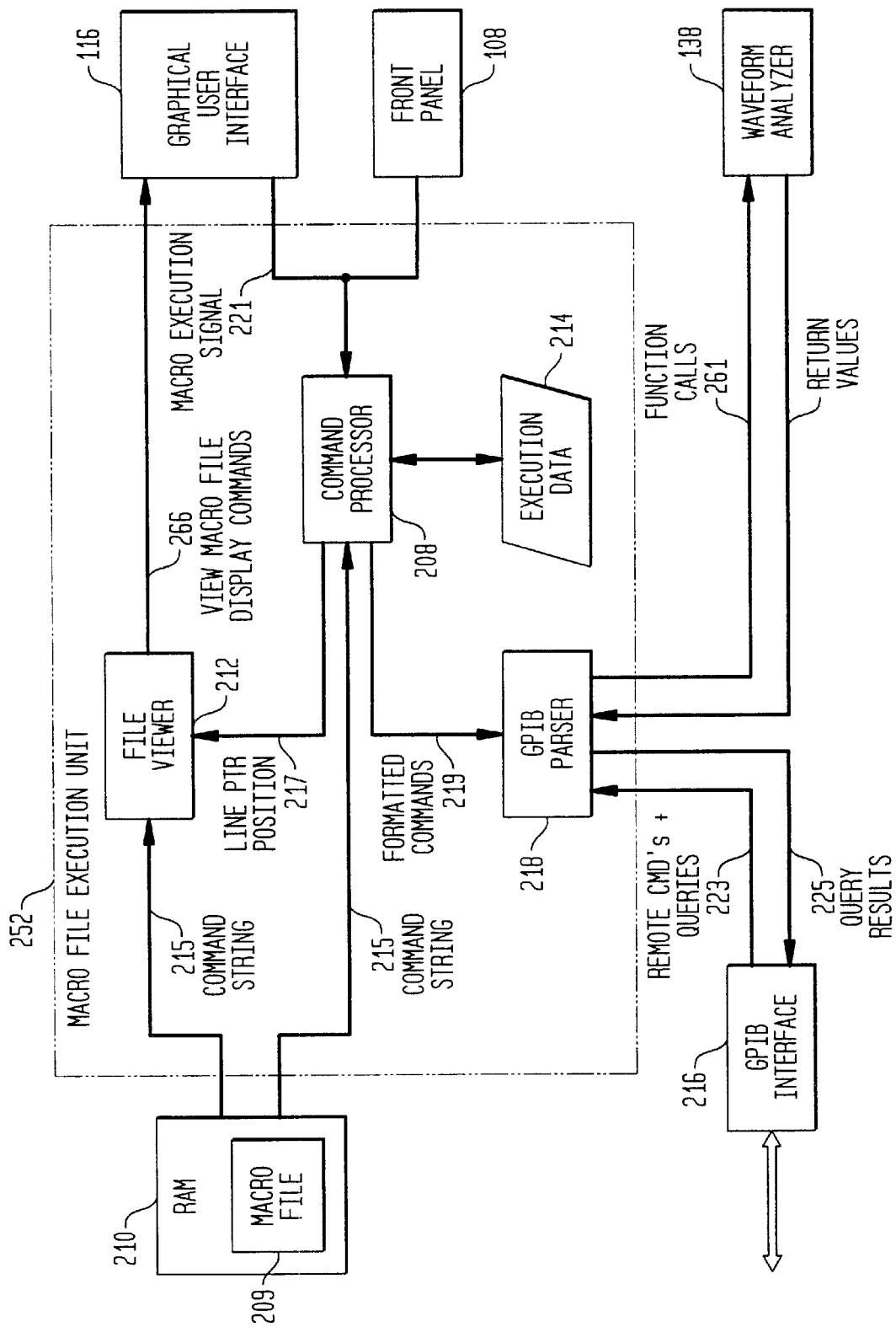
FIG. 2C is a detailed functional bock diagram of a macro file execution unit illustrated in FIG. 2A.

FIGS. 2B and 2C are detailed functional block diagrams of macro file generation unit 250 and macro file execution unit 252, respectively. Each of these components of instrument control macro manager 118 is described below.

A. Macro File Generation Unit

Referring to FIG. 2B, as noted, macro file generation unit 250 provides an interactive environment for the operator to facilitate the generation of and storing of executable macro file 209 in RAM 210 for subsequent execution. Macro file generation unit 250 includes primarily a text editor 206 and a file processor 202. Generally, text editor 206 operates with graphical user interface 116 to provide a text file editing environment with which the operator can develop one or more macro text files 204. Text editor 206 generates text strings 205 forming a macro text file 204 which is stored in a memory device. Macro text files 204 include various text strings 205 including command strings 215 as well as comment lines, blank lines, etc. (not shown).

File processor 202, responsive to a macro selection command 211 generated by the operator retrieves a selected macro file 207 from macro text files 204 stored in any accessible memory. In this example, macro selection command 211 is generated through graphical user interface 116. File processor 202 modifies selected macro file 207 to extract the instrument and macro control commands 280, 282 that are to be executed by macro file execution unit 252, storing the command strings 215 in RAM 210. The details of text editor 206 and file processor 202 will now be described below.

As noted, macro file generator 250 preferably provides a text-editing environment enabling the operator to develop one or more macro text files 204 each including at least one instrument control command. To provide the desired editing environment, text editor 206 generates various macro file editing environment signals 201 to cause the display of editing windows, dialog boxes and associated display elements on a display device through graphical user interface 116. The operator utilizes the editing environment to create or modify a macro text file 204. In response to these operator activities, graphical user interface 116 generates editing commands 203 that are received by text editor 206. Text editor 206 manipulates the macro text file 204 in response to operator commands 203. Various displays presented by graphical user interface 116 to provide an editing environment are described below.

FIGS. 3A–3D are exemplary embodiments of various displays presented on display device 112 by graphical user interface 116. As noted, signal measurement system 100 preferably includes a graphical user interface 116 which provides an interactive graphical environment through which an operator can visualize and control various features of signal measuring system 100, including the present invention. In this illustrative embodiment, an operator can develop, modify and select a macro text file 204 through the manipulation of various display elements such as dialog boxes, windows and their associated buttons, menus and the like.

Generally, graphical user interface 116 provides a waveform display region 302 in which one or more waveforms 306 are shown. Surrounding waveform display region 302 are a number of menu bars and the like to enable the operator to control oscilloscope 100 through graphical user interface 116. One menu bar pertinent to the present invention is the main menu 304 displayed above waveform display region 302.

In the illustrative embodiment, an operator creates, edits, selects or otherwise interacts with a macro text file 204 through the selection of a menu item in the "Measure" pull-down menu 310. Thus, the operator must select the "Measure" display item 308 on main menu 304. This causes the system to display a measurement pull-down menu 310. Of the displayed menu items on measurement pull-down menu 310, "Customize QuickMacro . . ." menu item 312 is of significance to the invention.

Figure 3A:
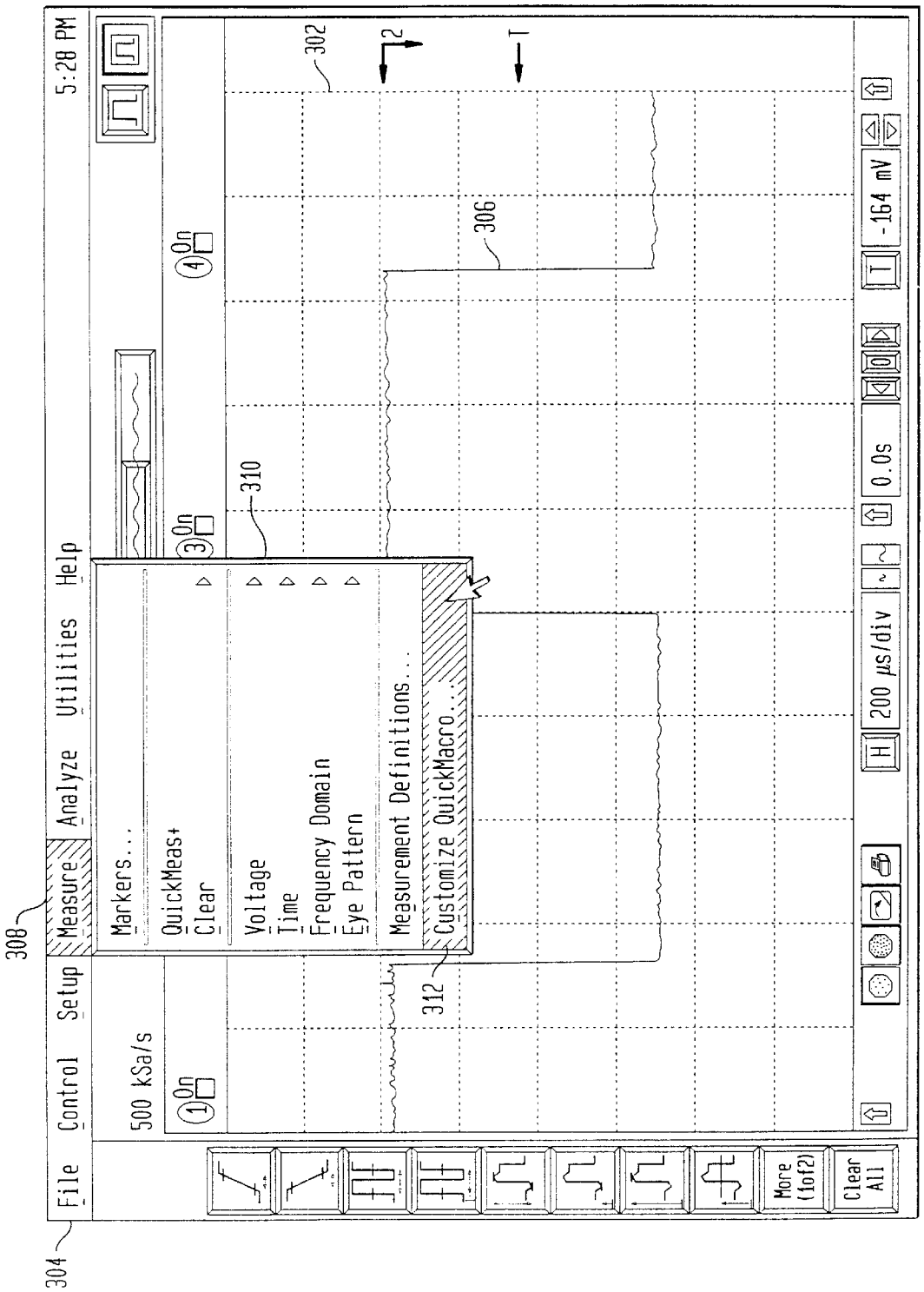
FIGS. 3A–3H are embodiments of graphical user interface displays generated in connection with the instrument control macro manager of the present invention.
Figure 3B:
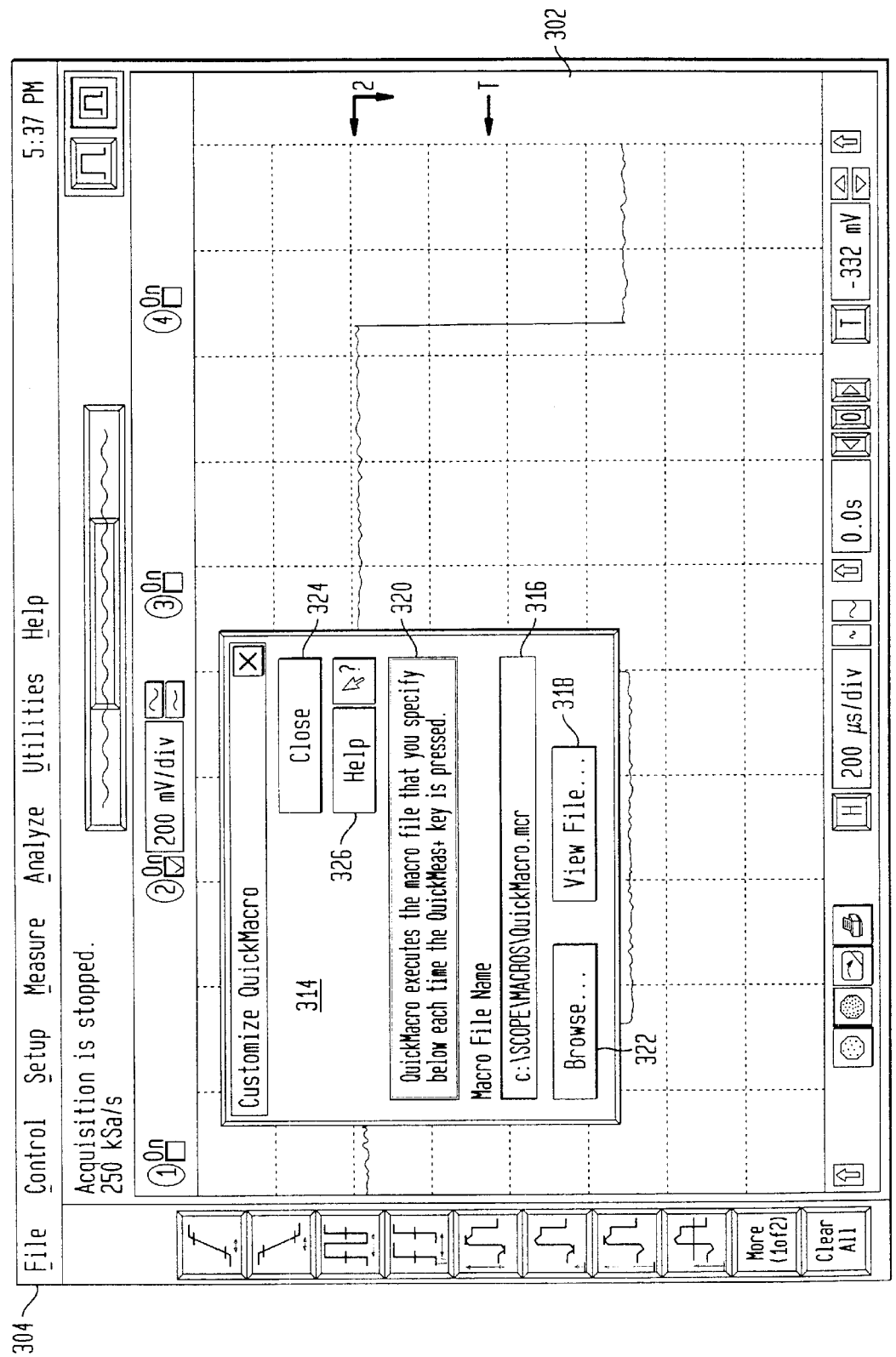

Referring to FIG. 3B, selection of "Customize Quick-Macro . . ." menu item 312 on pull-down menu 310 causes the system to generate a QuickMacro command dialog box 314. Dialog box 314 includes various display elements to enable an operator to select a desired operation related to instrument control macro manager 118. The operations include selecting a macro text file 204 for editing and/or execution. The former is performed by text editor 206 while the latter is performed by macro file execution unit 252 (discussed below).

A file path display line 316 is provided in dialog box 314 to identify the currently selected macro text file 204. Here, the path and name of the current macro text file 204 is "c:\SCOPE\MACROS\QuickMacro.mcr." Should the operator desire to edit a different macro text file 204, the operator can select the "Browse" button 322 which causes the display of a dialog box described below.

Dialog box 314 includes a text display region 320 in which a description of the features, instructions, etc., are provided to assist the novice operator. In addition, standard dialog box buttons such as close and help buttons 324, 326 are provided.

Figure 3C:
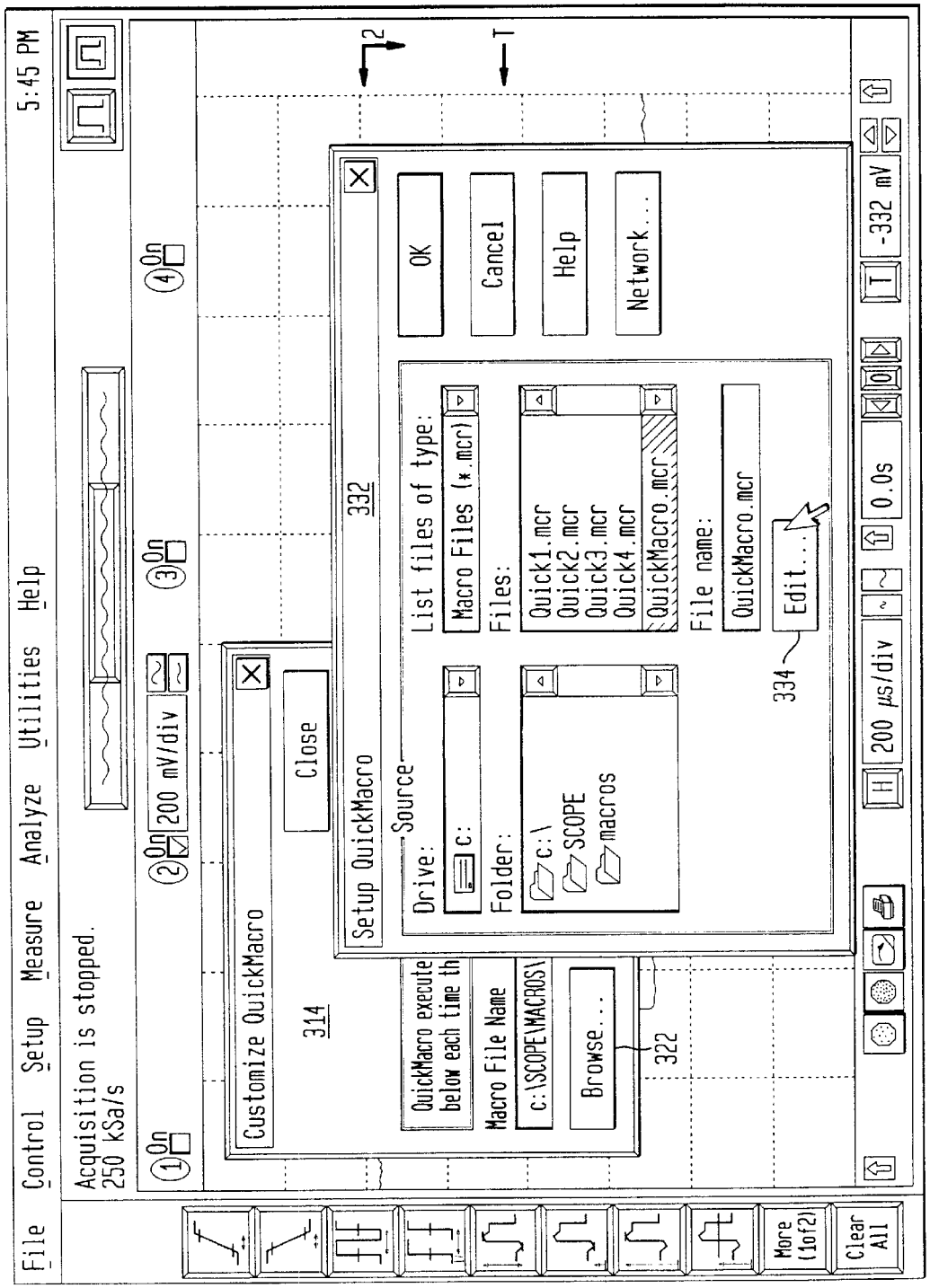

FIG. 3C is an example of a Setup QuickMacro dialog box 332 displayed in response to the operator selecting browse button 322 on dialog box 314. Setup QuickMacro dialog box 332 is similar to a common file selection dialog box and includes disk drive, folder and file selection display windows. As noted, in aspects of the invention the operator may generate more than a single macro text file 204. In such a circumstance, the operator may utilize the dialog box selection features to select a desired macro text file 204 from those available.

Figure 3D:
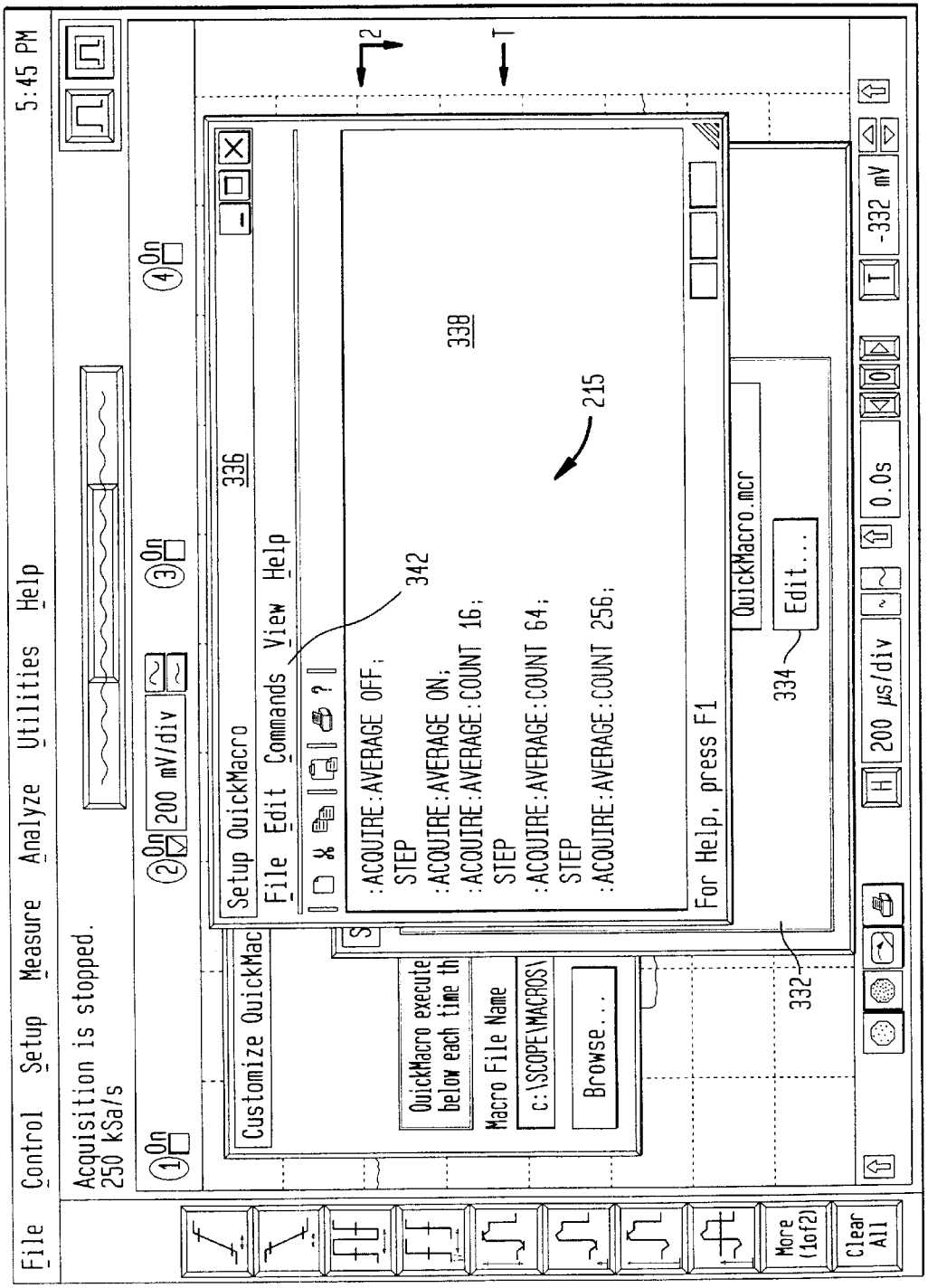

One example of text editor window 336 is illustrated in FIG. 3D. Referring now to FIG. 3D, a "Macro Editor" window 336 includes a display region 338 in which a selected macro file 207, is displayed. Macro editor 336 provides a text editing environment as is well known in the art. Menu command line 340 provides many of the common command line menu items found in, for example, commonly available GUI-based text editors. In addition to such conventional functionality, macro editor window 336 provides additional features described below. In the illustrative example, macro file EX4 described above is displayed in display region 338.

Figure 3E:
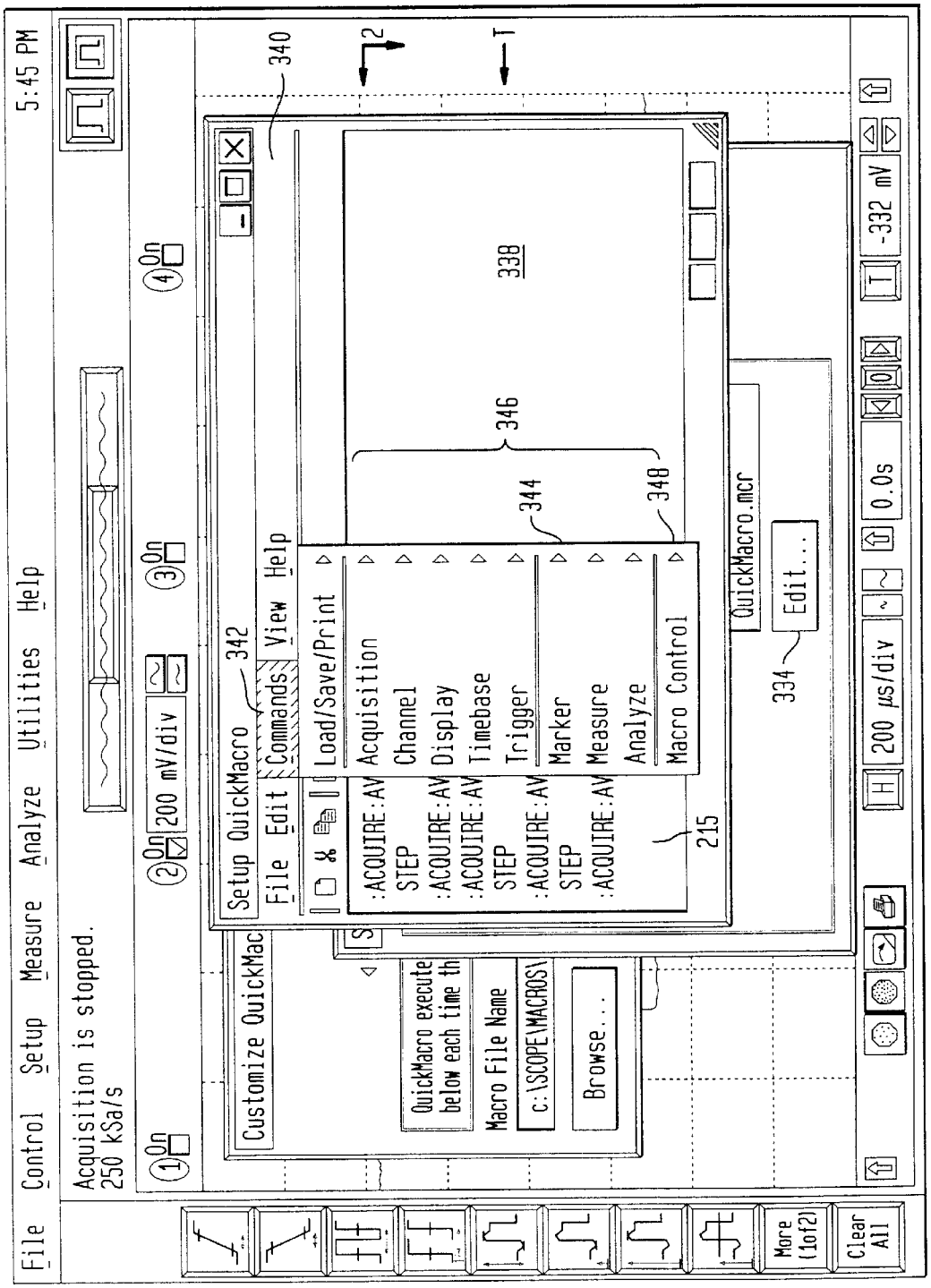
Figure 3F:
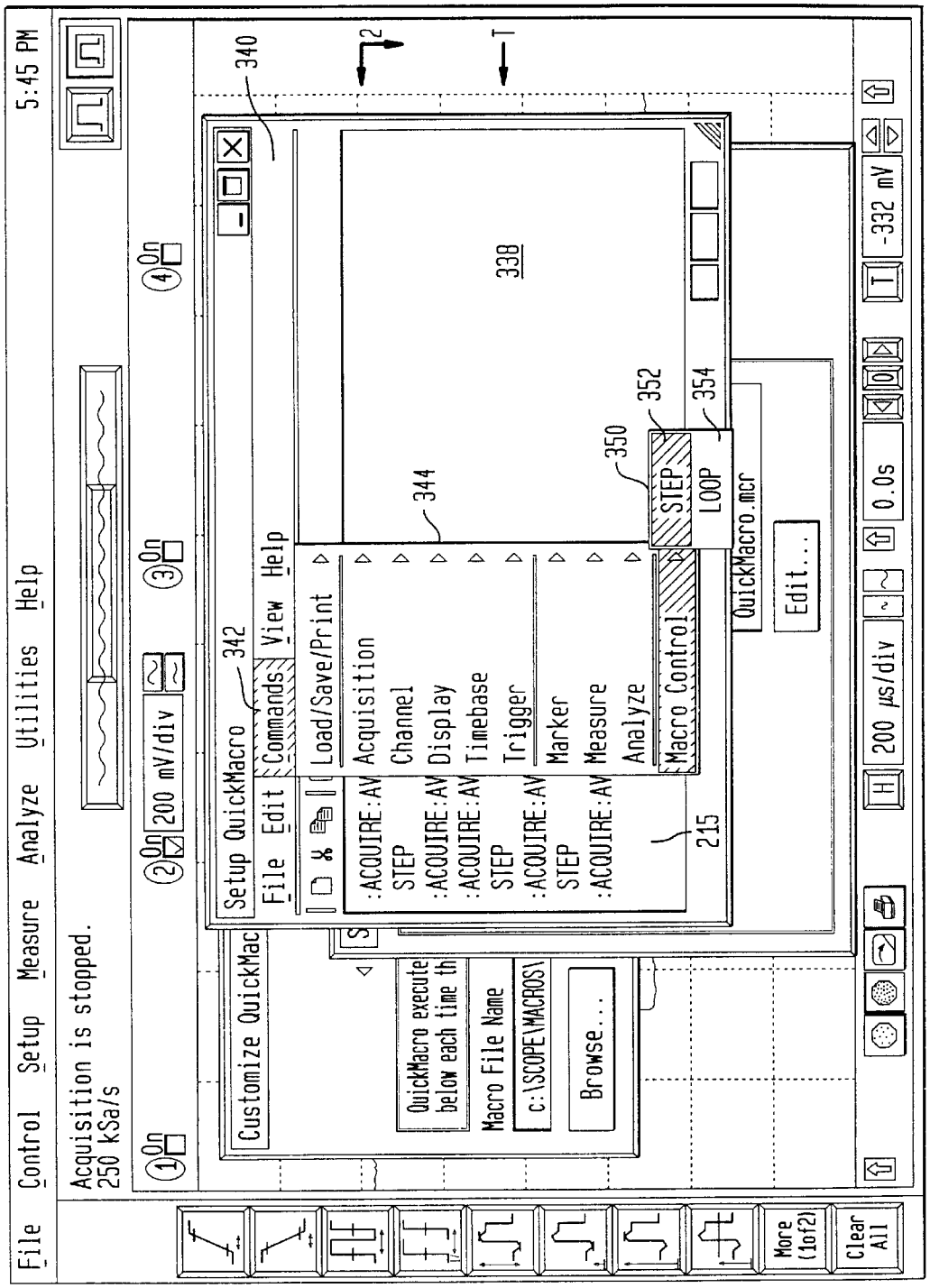
Figure 3G:
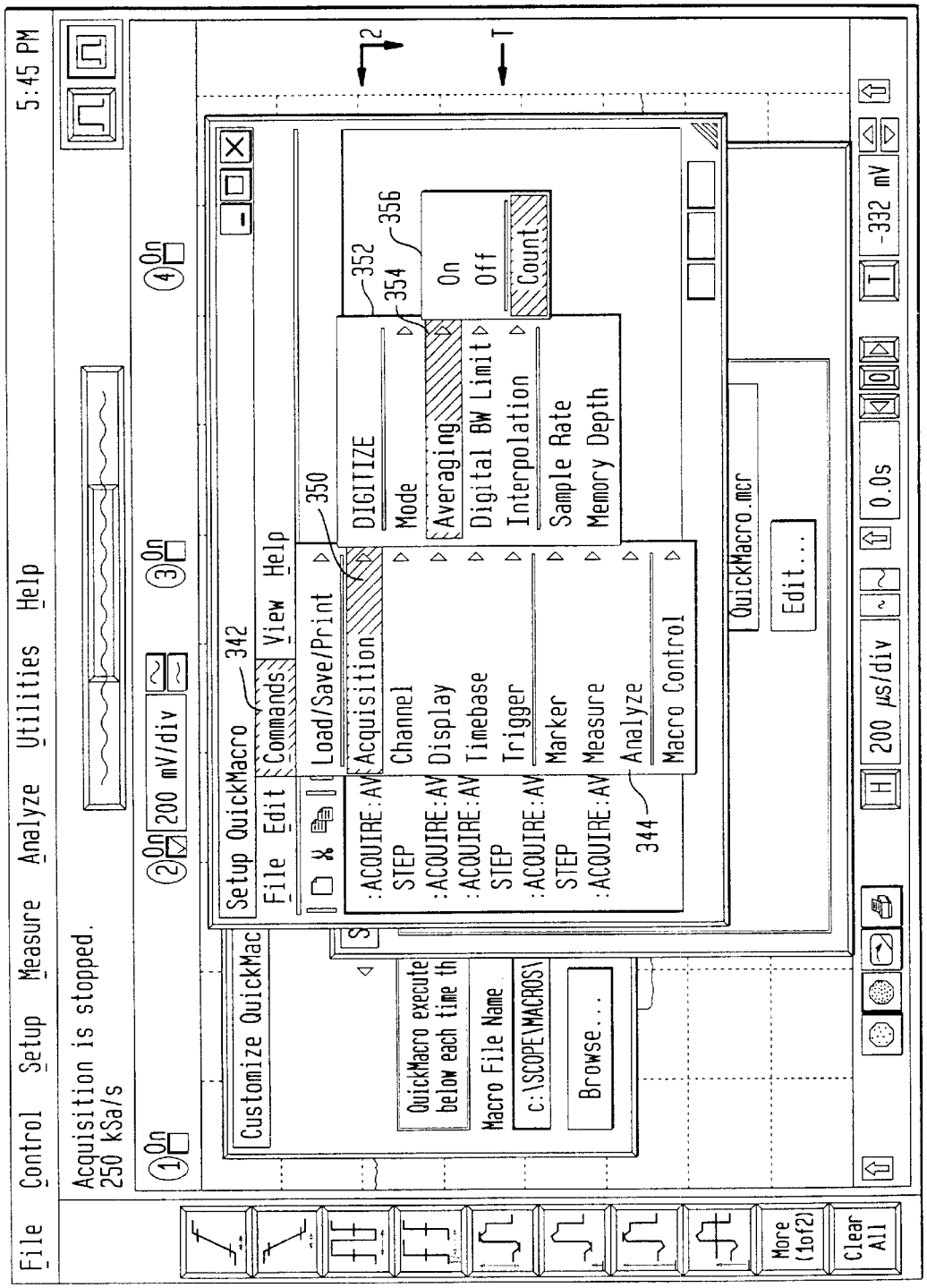

In one implementation, text editor 206 has operational access to a command data structure 220, a schematic illustration of which is shown in FIG. 2D. Data structure 220 provides an indexed searchable list of some or all GPIB command strings 260 that are available to the operator to generate a macro text file 204. Text editor 206 utilizes GUI 116 to provide the operator with a display list from which the operator can easily select commands 260 for inclusion into macro text file 204. FIGS. 3E–3G are displays of a graphical user interface illustrating the manner in which such information may be presented to the operator in one embodiment of the invention. Providing the operator with a display of available instrument and macro control commands from which the operator can make a selection insures that proper commands can be quickly identified, and that typographical errors on the part of the operator can be eliminated. This also eliminates the need for the operator to recall the requisite syntax of the command, making the present invention significantly easier to use compared with conventional approaches.

Referring to FIG. 2D, as an alternative embodiment, GPIB command strings 260 are also indexed to common short names 262 and alternate descriptions 264 of the instrument's functionality. Command data structure 220 can also retain group identifiers 266 of GPIB command strings 260 according to some predetermined criteria. GPIB command strings 260 can be functionally grouped according to, for example, type of function performed. The display of such information on GUI 116 further assists the operator in quickly understanding the operation of each GPIB command strings 260 and in locating a desired command string from what can be numerous available command strings. These aspects of the invention will now be described with reference to exemplary GUI displays shown in FIGS. 3E–3G.

Text editor window 336 includes a main menu 340 of text editor window 336 a "Commands" menu item 342 is displayed. Selection of "Commands" menu item 342 causes a command category pull-down menu 344 shown in FIG. 3E to be displayed. As noted, in one embodiment, instrument and macro control commands can be functionally grouped together. Referring to pull-down menu 344, instrument and macro control commands 280, 282 are grouped according to type of function performed. The function to which each command string 215 is assigned is located on group identifier 266 of command data structure 220. Thus, in pull-down menu 344, there are 8 menu items 346 each representing a different functional grouping of GPIB instrument control commands. There is one menu item 348 representing the macro control commands. Displaying GPIB commands 260 in major functional groupings enables the operator to quickly identify and locate the command of interest from a large number of potential commands. This approach also enables the operator to be reminded of the command strings 215 that are available to perform a particular operation.

Referring to FIGS. 3E and 3F, selection of menu item 348 entitled "Macro Control" causes the display of a pull-down menu display 350 in which the available macro control commands are illustrated. In this example, there are two such menu items: "STEP" 352 and "LOOP" 354. The short names presented on pull-down menu 350 are located in associated field 262 of command data structure 220.

Referring to FIGS. 3E and 3G, the selection of an instrument control category menu item from pull-down menu 344 causes text editor 206 to display a pull-down menu 352 which provides short names for each of the functionally-related instrument control commands. As noted, in command data structure 220 GPIB command strings 260 have associated with them common short names 262 which are displayed in pull-down menu 352 to further assists the operator in quickly identify and select a desired command string 260.

One such instrument control category menu item is Acquisition 350. Selection of acquisition menu item 350 causes the display of a sub-pull-down menu 352 providing a short title of available GPIB commands related to the acquisition of signals. Selection of "Averaging" menu item 354 results in the represented command string to be inserted in the displayed text edit field identified by a current cursor location.

There are many commands that require arguments or parameters to be specified by the operator. For example, when performing an averaging function, the operator may need to specify the number of acquisitions over which the average should be calculated. In the embodiment illustrated in FIG. 3G, a pull-down menu 356 displaying the operator-control data is displayed for the "Averaging" instrument control command menu item. Three operator-specified parameters are displayed in the example shown in FIG. 3G. The averaging function may be turned on, it may be turned off and the number of samples over which the average is to be calculated ("Count") are provided. Selection of these parameter menu items causes the value to be set accordingly, as in the case of the on/off menu items, or causes the display of a dialog box into which the operator enters the requisite information, as in the case of the count menu item. There are other approaches that may be implemented. For example, in an alternative embodiment, GPIB command strings 260 stored in command data structure 220 includes characters indicating the number and location of such parameters. In this embodiment, text editor 206 is configured to recognize such characters and provides some form of visual indication to the operator that a particular parameter value is required. For example, text editor 206 may highlight the field in which such information is required, facilitating the creation of the macro text file.

Referring again to FIG. 2D, certain embodiments of command data structure 220 also include a description field 264 into which the associated GPIB command strings 260 is described in any desired degree of detail. Should additional information be required by the operator, functional description 264 can be displayed in response to, for example, the operator selecting the menu item with a right mouse key, dwelling the cursor on the menu item, etc.

In one embodiment, text editor 206 may also have access to a template data structure 222 in which macro file templates 268A–268N are stored. A schematic diagram of one embodiment of a template data structure 222 is illustrated in FIG. 2E. Template data structure 222 has stored therein one or more macro templates 268 that can be selected by the operator for display, combination and modification for a desired purpose. Such selection may be achieved through a display of a dialog box, menu list or the like through graphical user interface 116. In an alternative embodiment, templates 268 may be provided to the operator as examples of how one may organize a macro file to achieve a particular objective. Such templates may be displayed on the graphical user interface 116 in a well-known manner for viewing by the operator.

Although conventional text editors can be used, text editor 206 is preferably customized to facilitate the above macro file editing operations. Thus, a preferred text editor 206, embodiments of which have been introduced above, is more desirable than conventional text editors. It should be understood that other implementations of text editor 206 are also included within the scope of the present invention. For example, text editor 206 may include the capability to execute immediately a single instrument control command during a macro file development to demonstrate its effect to the operator. This is a capability that can be provided easily in those implementations wherein an interpreted programming language is utilized. As noted, in such embodiments an interpreter individually converts each command into the function calls appropriate to cause the represented operation to occur in the implementing signal measurement system.

Text editor 206 is integrated in digital oscilloscope 100 illustrated in FIG. 1. However, it should be appreciated that text editor 206 need not be implemented in the signal measurement system. Instead, macro files 204 may be generated external to signal measurement system 100 and may be transferred to the signal measurement system using, for example, magnetic media or a data communication link.

As noted, to provide a macro file development environment, GUI 116 receives command and control information 201 from text editor 206 and generates editing commands 203. The specific data structures and functions depend on the implemented operating system 114 and graphical user interface 116. One of ordinary skill in the relevant art would find it apparent to develop such function calls given the present disclosure.

It should be understood that text editor 206 may provide any combination of the above functions. Also, text editor 206 may be located in other components of signal measurement system 100 other than macro file generation unit 250. In certain embodiments, no text editor 206 is provided, and the operator generates macro files 204 externally, saving them to a memory device accessible to macro file generation unit 250.

As noted, file processor 202 retrieves a selected macro text file 207 from one or more macro text files 204 stored in memory. File processor 202 extracts instrument and macro control commands to define an executable macro file 209. Executable macro file 209 is then stored in RAM 210 for subsequent execution by macro file execution unit 252. The functions and operations of file processor 202 are dependent upon the format of macro text files 204, the syntax of the programming language with which the macro text files 204 are written and the format of command strings that can be executed by macro file execution unit 252. In the disclosed embodiment, file processor 202 removes non-executable text strings such as blank lines, comments, etc. In addition, file processor removes executable command strings that are prohibited. Such specific commands can be specified by the operator.

FIG. 4 is a flow chart of the primary processes performed by one embodiment of the present invention to generate an executable macro file 209 containing one or more executable command strings 215. Macro text files 204 are in a form that is easy for an operator to generate, understand and read. Through the performance of the operations set forth below, file processor 202 converts a selected macro text file 207 to an executable macro file 209. Executable macro file 209 contains one or more executable command strings 215 suitable for execution by macro file processor 252. In the disclosed embodiment of macro manager 118, the following functions are performed by file processor 202. It should be understood, however, that these operations can be distributed over a number of elements of macro manager 118.

Referring now to FIG. 4, process 400 begins at block 402 in response to a request that macro manager 118 select a particular macro text file 207. In the disclosed embodiment, this request is represented by a macro selection command 211 generated by graphical user interface 116. In alternative embodiments, the invocation of process 400 and the identification of a selected macro text file 207 may received through GPIB interface 216, generated by another process executing in signal measurement system 100, etc.

At block 404 file processor 202 reads selected macro text file 207. As noted, there may be more than one macro text file 204 available to be selected by the operator. Such macro text files are stored in any known storage medium accessing to file processor 202. In those embodiments wherein a single macro text file 204 is available or can be generated at any given time, then the process performed at block 404 may not include processing specified macro file names and paths.

At block 406 file processor 202 removes blank lines and comments from selected macro text file 207. Macro text files 204 may include such additions beyond the executable instrument control commands 280 and macro control commands 282, if any. Such additional lines of text facilitates the development and subsequent understanding of the contents and operations of macro text file 207. However, such blank lines and comments are not recognizable by, and therefore interfere with, the operations of GPIB parser 218. Accordingly, such blank lines and comments are stripped from selected macro text file 207 and discarded at block 406. For example, in the illustrative embodiment, comments are preceded by a pound sign. In such implementations, all text to the right of a pound sign is considered to not be a command and is removed, with the pound sign itself, from selected macro file 207.

As noted, signal measurement system 100 may include a communication interface through which system 100 can be controlled remotely. In such an embodiment, a pre-existing GPIB parser 218 communicates with GPIB interface 216 through which GPIB commands & queries 223 are received from an external processor. Queries are conventional GPIB commands that are issued by a remote control device to request that instrument 100 transmit a designated piece of information, such as the rise time of a specific channel signal or the volts per division setting for a particular channel. In response, GPIB parser 218 accesses signal measurement system 100 to retrieve the requested data. The generation of a query; that is, a request for information, is unrelated to the purpose of the present invention to generate a macro file that controls the operation of signal measurement system 100. Since GPIB queries are not applicable to the operations of macro manager 118, they are stripped from selected macro file 217 and discarded at block 408. The GPIB protocol dictates that such queries have a question mark as a last character. In this embodiment, all command lines having a question mark at their end are removed at block 408. This may occur, for example, when a macro file 204 is imported into system 100 via disk or network interface.

At block 410 disallowed commands are removed from selected macro file 207. In certain embodiments there may be specific commands that satisfy the syntax requirements of the implemented programming language, but cannot be executed in the connection with the present invention. Such specific, non-applicable instrument control commands are removed from selected macro file 207 at block 410. For example, there are GPIB commands that change the command language of the signal measurement system. Signal measurement systems responsive to such commands can then be designed to be backwards compatible with previous products. The remote controller can then specify which command language it is compatible with and the signal measurement system 100 can reconfigure itself for compatibility. These and other specific, non-applicable instrument control commands are removed from selected macro file 207 at block 410.

At block 412 leading and training blank characters are removed. Once the operations described with reference to blocks 406-412 are completed, the resulting executable macro file 209 is stored for subsequent execution by macro file processor 252. File processing 400 then cease at end block 416. An example of the processes performed by file processor 202 on a selected macro text file 207 to generate an executable macro file 209 is presented below. The following selected macro text file 207 is:

Macro file to vary the number of averages

:SYSTEM:LANGUAGE :545X;

:ACQUIRE:AVERAGE OFF;

:ACQUIRE:AVERAGE:COUNT?;

STEP

:ACQUIRE:AVERAGE:ON;

Here, the dashed lines represents the extent of the file and are not actually part of the file. Comments are indicated by a leading # sign while queries are indicated by a trailing question mark. This macro text file is processed by file processor 202 to result in the following executable macro file 209:

:ACQUIPE:AVERAGE OFF;

STEP

:ACQUIRE:AVERAGE:ON;

Note that the LANGUAGE command does not appear in the above executable macro file 209. In the GPIB programming language, the LANGUAGE command switches the entire GPIB grammar to another grammar set. Such a command does not apply to the application of the present invention and, therefore, is disallowed.

As noted, queries are also disallowed because they cause the instrument to transmit data back to the place that sent the command. Prior to the application of the present invention, this was an external controller. As such, these commands area also filtered by file processor 202. This results in the command strings 215 illustrated above.

B. Macro File Execution Unit

As noted, macro file execution unit 252 executes command strings 215 of a selected executable macro file 209. The execution is preferably performed in response to the receipt of a single macro execute signal 221 generated in response to the activation of a macro control key 200 on front panel 108, or from the selection of a display element on GUI 116. For each command string 215, macro file processor 252 generates one or more function calls 261 appropriate for causing signal measurement system 100 to perform the operations associated with that command string 215.

Macro file execution unit 252 includes generally a command processor 208, a file viewer 212 and, in this embodiment, a GPIB parser 218. Command processor 208 processes command strings 215 while file viewer 212 provides a display of the macro file execution process. Command processor 208 generates formatted commands 219 suitable for processing by a GPIB parser 218 to generate function calls 261 to waveform analyzer 138.

File viewer 212 receives a line pointer position signal 217 from command processor 208 indicating which command string 215 of an executed macro file 209 is currently being processes. File viewer 212 retrieves command strings 215 from RAM 210. File viewer 212 generates macro file display commands 266 that cause GUI 116 to display a window in which the command strings 215 of macro file 209 are displayed. Preferably, line pointer position 217 is utilized to provide some visual indication of which command string 215 is currently being executed by execution unit 252. This is shown in the graphical user interface illustrations introduced and described below.

Figure 3H:
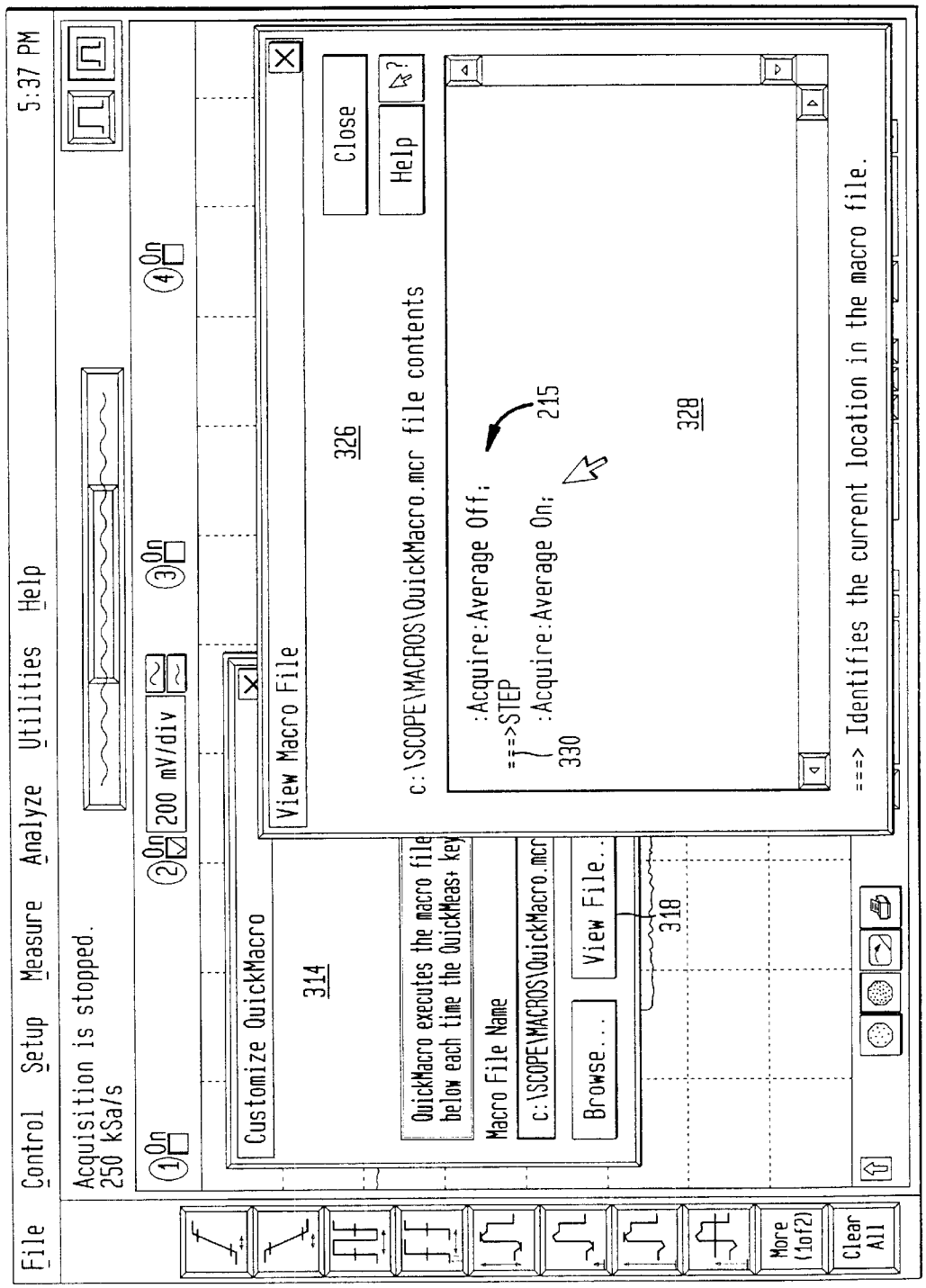

FIG. 3H is a diagram of a window that is displayed in response to the operator graphically selecting the "View File . . ." button 318 on dialog box 314. View Macro File window 326 provides a display region 328 in which a macro file 209 is displayed. In the example illustrated in FIG. 3H, macro file EX3 described above is displayed. In the illustrative embodiment, the second command string 215, Step, is visually distinguished to the provide the operator with an indication that execution of macro file EX3 is paused at this command string.

As noted, the macro files that can be generated by the operator with the present invention include a representation of the instrument control functions. In the described embodiment, the instrument control functions are represented by the GPIB commands. This preference is due to the fact that the implementing system will often include a GPIB interface and parser. GPIB is commonly used to control instruments remotely with a computer interface.

Command processor 208 will now be described in greater detail below. Command processor 208 generates state information during the execution of command string 213. In the illustrative embodiment, a data structure of such state variables is maintained by execution unit 208. FIG. 2E is a schematic diagram of one example of a data structure 214 suitable for storing execution unit state data. The state variables stored in execution data structure 214 include loop counter 280, line pointer 282 and abort flag 284. As noted, in this illustrative embodiment, a Loop token may be include in macro files 204 to enable the operator to crate macro files that repeat one or more operations. When executing such macro files, the number of times the loop operations have been performed is maintained in loop counter state variable 208. A line pointer 282 is maintained by execution unit 208 to identify which command string 213 of a macro text file 204 is currently being executed by execution unit 208. The contents of line pointer state variable 282 is provided to file viewer 212 as line pointer position 217. The abort flag state variable 284 maintains the state of the abort flag which is generated as one of the optional states of macro execution signal 221. The state of the abort flag is stored in state variable 282 as is utilized by execution into 208 to end prematurely the execution of a macro text file 204. As will be described in further detail below, the execution unit 208 may unable to complete processing of a macro file due to the macro file execution pausing until a condition that does not occur, an endless loop condition, etc.

Figure 6A:
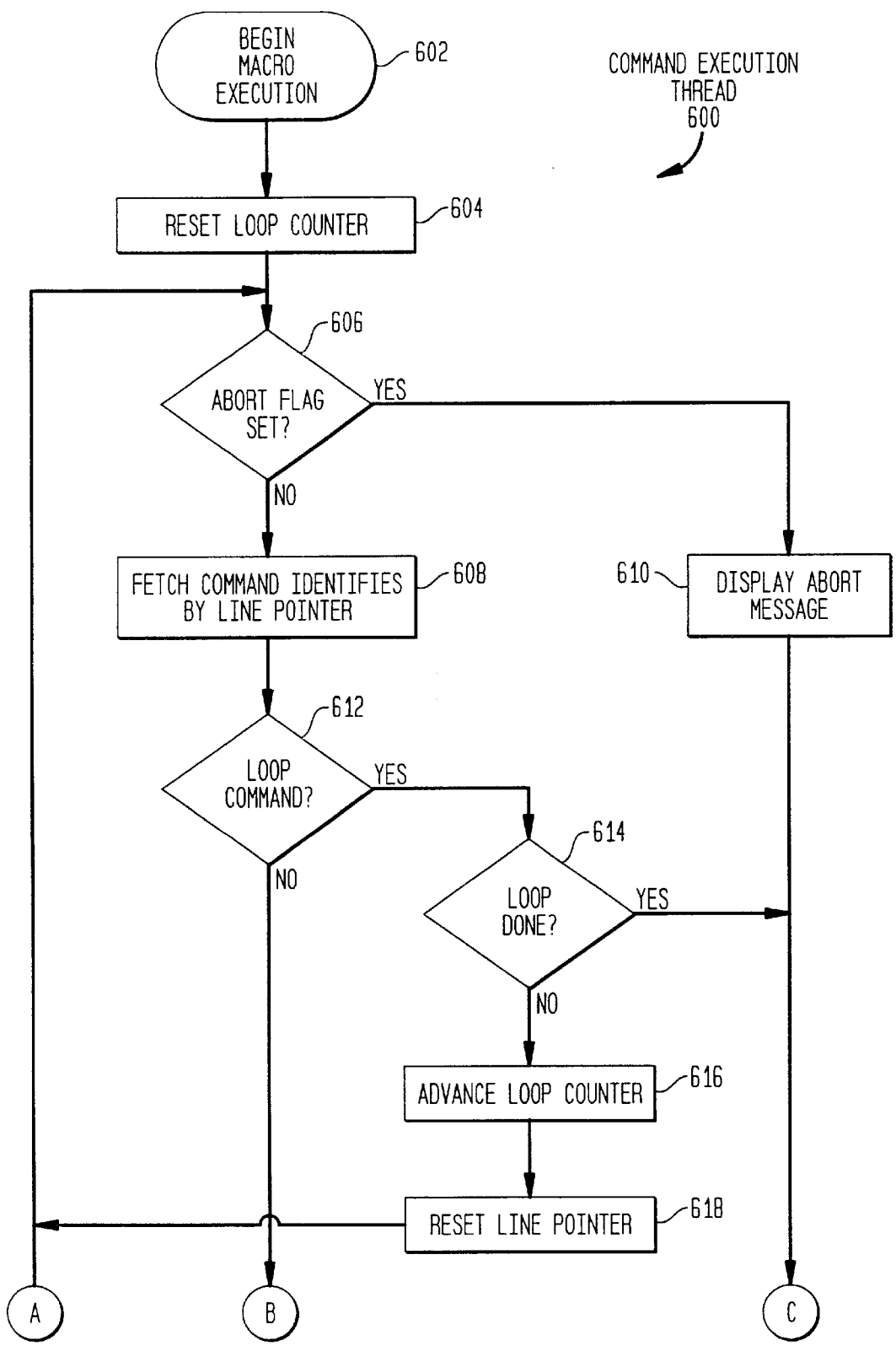
FIGS. 6A–6B are is one embodiment of a command thread process performed in accordance with one embodiment of the present invention.
Figure 6B:
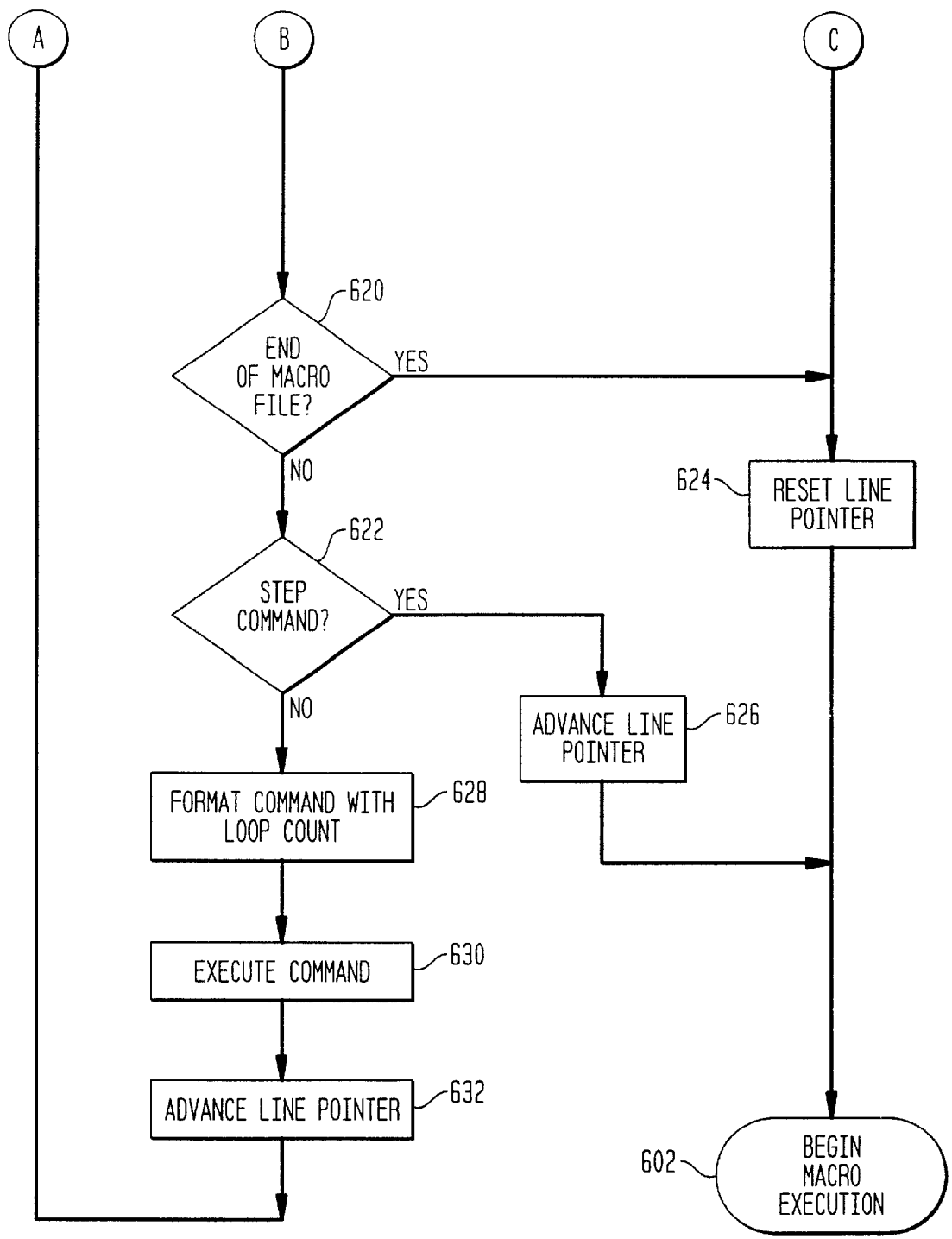

The processes performed by command processor 208 to execute a selected macro text file 207 will now be described with reference to FIGS. 5 and 6A–6B. As noted, execution unit 252 retrieves command strings 215 from RAM 210 for execution. Such command strings 215 may include instrument control commands as well as macro control commands. The latter causes execution unit 208 to pause for an external event, enter into a loop in which is repeatedly processes commands, etc. These and other commands can cause the execution unit 208 to enter a processing state from which it cannot recover. Should this occur, the operator may be unable to cease processing because execution unit 208 cannot detect the presence of macro execution signal 221. To insure unrecoverable conditions do not occur, the execution of command strings 209 is managed by two threads of execution, a main thread that is responsive to macro execution signal 221 and a command execution thread that executes command strings 213. On example of the main thread process 500 is illustrated in FIG. 5 while an exemplary command thread process 600 is illustrated in FIGS. 6A and 6B.

Referring now to FIG. 5, a flow chart of one embodiment of the main macro execution process 500 will now be described. In the disclosed exemplary apparatus, the described functions are performed by a command processor 208, although other configurations are possible.

Process 500 begins a begin block 502 in response to the receipt of a macro execution command 221 generated by the operator pressing the dedicated macro control front panel key 200. In the embodiment illustrated in FIG. 2, this same signal can be generated by graphical user interface 116 should the operator be currently working with GUI 116. In either case, upon receipt of signal 221 execution unit 208 performs process 500.

At block 504 execution unit 208 determines whether the command thread 600 (FIGS. 6A–6B) is currently being executed. If so, then the operator's pressing of macro execution key 200 is interpreted as a desire on the part of the operator that the macro command thread be terminated. Processing then continues at block 505 at which an abort function is executed. At block 506 a loop abort flag 284 is set. The abort function serves as a high level interrupt to cease processing on the main and command threads. Loop abort flag 284 is utilized by command execution thread 600 to prevent command thread 600 from remaining in an endless loop condition, as will be described below. Process 500 thereafter ceases at block 512.

If it is determined at block 504 that command thread 600 is not currently being executed, depression of macro key 200 is interpreted as a desire that the command thread begin. Processing then continues at block 508 at which the macro command thread is generated. At block 510 the command thread is then executed and processing on the main thread ceases at end block 512.

Referring now to FIGS. 6A and 65B, one example of the operations performed by a command execution thread 600 is illustrated. As noted, there are a number of state variables maintained by command processor 208 during the processing of command strings 215. These include a loop counter 280 that maintains the number of passes through an execution loop, line pointer 282 that identifies the command string 215 currently being executed, and an abort flag 284.

Process 600 begins at block 602 after being invoked by main processing thread 500. At block 604 loop counter 280 is reset. This occurs the first time through process 600, with the processing of each command line of macro file 209 being performed with the repetitive execution of the following processing blocks. At block 606 the status of abort flag 284 is determined. If abort flag 284 is set then an abort message is displayed at block 610 and line pointer 282 is reset to the top of the macro file at block 624 before process 600 ceases.

As noted, abort flag 284 is set by main macro execution thread 500 when a macro execution signal 211 is received while a main macro execution thread 500 is currently executing. If it is determined at block 606 that abort flag 282 is not set, then the macro file command identified by the current line pointer 282 is retrieved from RAM 210. If the retrieved command 215 is a LOOP command, as determined at block 612, then processing continues at block 614 at which the status of the loop is determined. If the specified number of passes through the loop have been completed, then processing continues at block 624 at which line pointer 282 is reset and process 600 then ceases. If the loop is not completed (block 614) then processing advances to blocks 616 and 618 at which loop counter 280 is advanced and line pointer 282 is reset to the top of the macro file in preparation of executing the next loop. The above process is then repeated for the next command in the current loop that is being processed. As shown by process 600, a LOOP command must occur at the end of the macro file and all preceding commands are repeated as defined by the LOOP command. If there are any additional command appearing in the selected macro file after the loop command, the additional commands will fail to be executed.

If at block 612 it is determined that the retrieved command is not a LOOP command then processing continues at block 620. If the end of the macro file is detected at block 620 then the line pointer is reset at block 624 and process 600 ceases. Otherwise, whether the current command is a STEP command is determined at block 628. If so, then line pointer 282 is advanced at block 626 and process 600 ceases. Alternatively, if the retrieved command is not a STEP command, then processing continues at block 628 at which the command is formatted with the loop count. That is, if the command has a "%d" in it, this characteristic is replaced with the loop count 280.

The command is then executed at block 630. That is, the command is dispatched to the GPIB parser 218 for interpretation. The line pointer is advanced at block 632 and the process is repeated from block 606 for the next command in RAM image 210.

It should be noted that the above division of processing in the two threads of execution 500 and 600 prevent the front panel from becoming inaccessible during the execution of the command execution thread Process 500 executes only to invoke process 600 when a macro execution signal 221 is received from front panel 108. Front panel 108 is available so that the operator can access other controls and perform other operations despite the fact that the command thread is currently running.

In addition, the above configuration enables the execution of macro file 209 to be halted should there be a problem in the processing. Specifically, abort flag 284 is checked each pass through the loop iteration of command execution thread 600 to avoid problematic conditions such as a loop process that cannot cease. In addition, the abort function invoked by process 500 ceases processing when conditions occur that cause the system to be unintentionally suspended, such as waiting for a trigger condition to occur, regardless of whether that command is included in a loop. By invoking the abort function and setting abort flag 284 in a separate thread of execution, the operator can simply press macro button 200 to terminate processing.

While various embodiments of the present invention have been described above, it should be understood that they have been presented by way of example only, and not limitation. Thus, the breadth and scope of the present invention are not limited by any of the above-described exemplary embodiments, but are defined only in accordance with the following claims and their equivalents.

What is claimed is:

1. A macro management system embedded in a signal measurement instrument that provides an operator of the signal measurement instrument with a capability to invoke execution of an operator-defined executable macro file comprising one or more instrument control commands through a single operator action, wherein the macro file is stored by the signal measurement instrument and each said one or more instrument control commands represents one or more instrument control operations to be performed by the signal measurement instrument.

2. The system of claim 1, wherein said single operator action is activation of a macro control key on a control panel of the signal measurement instrument.

3. The system of claim 1, wherein said single operator action is a graphical selection of a display element presented on a graphical user interface of the signal measurement instrument.

4. The system of claim 1, wherein said one or more instrument control commands comprising said macro file are descriptive, high level commands of an instrument control language.

5. The system of claim 4, wherein said instrument control language is GPIB.

6. The system of claim 1, wherein said macro management system comprises:

a macro file generation unit configured to provide the operator with a capability to develop, store and edit one or more macro text files each comprising one or more text strings, wherein said text strings include said one or more instrument control commands.

7. The system of claim 6, wherein said one or more text strings further comprise:

one or more macro control commands for controlling execution of said macro text file.

8. The system of claim 6, wherein said macro file generation unit provides a text-editing environment on a graphical user interface to facilitate said development, storing and editing of said macro text file.

9. The system of claim 1, wherein said macro management system comprises:

a macro file execution unit configured to execute said executable macro file, wherein said execution is initiated in response to receipt of a single macro execution signal generated in response to said single operator action.

10. The system of claim 9, wherein as each instrument control command is executed, said macro file execution unit generates one or more function calls that causes the signal measurement instrument to perform said one or more instrument control operations represented by the executed instrument control command.

11. The system of claim 7, wherein said one or more macro control commands comprises:

a step command that, when executed by said macro file execution unit, causes said macro file execution unit to halt execution of said executable macro file until a next macro execution signal is received.

12. The system of claim 7, wherein said one or more macro control commands comprises;

a loop command that causes said macro file execution unit to execute one or more command strings repeatedly for a specified number of iterations.

13. The system of claim 6, wherein said macro file generation unit comprises:

a text editor configured to operate with a graphical user interface to provide a text file editing environment with which the operator can develop said one or more macro text files; and a file processor configured to process said one or more macro text files to generate said executable macro file.

14. The system of claim 13, wherein said file processor, responsive to a macro selection command, retrieves a selected macro text file from said one or more macro text files.

15. The system of claim 13, wherein said text editor utilizes the graphical user interface to provide the operator with one or more display lists of command names from which the operator can easily select a command strings for inclusion into said macro text file, wherein selection of a command name causes said selected command string to be inserted into said macro file.

16. The system of claim 15, wherein said command strings are displayed in accordance with predetermined groups.

17. The system of claim 15, wherein one or more of said commands require arguments or parameters to be specified by the operator and wherein said text editor displays on said graphical user interface one or more prompts for the operator to enter said arguments or parameters through the graphical user interface.

18. The system of claim 13, wherein said text editor includes a template data structure in which macro file templates are stored, and said text editor displays an operator selected template for viewing by the operator.

19. The system of clam 13, wherein said ale processor converts a selected macro text file to an executable macro file by removing blank lines, queries, disallowed commands and leading and trailing blank characters.

20. The system of claim 19, wherein said macro file execution unit comprises:
a command processor that processes command strings to generate formatted commands; and
a GPIB parser that generates, for each of said formatted commands, one or more function calls that causes the signal measurement system instrument to perform said one or more instrument control operations represented by the executed instrument control command.

21. The system of claim 20, wherein said macro file execution unit further comprises:
a file viewer configured to cause generation of a display of said executable macro file with a visual indication of which command string of said executable macro file is currently being executed by said execution unit.

22. An apparatus for use in a signal measurement instrument constructed and arranged to enable an operator to temporarily assign control of one or more instrument control operations to a single control panel switch of the signal measurement instrument to which the operator has direct access.

23. A method for executing an operator-defined executable macro file comprising one or more instrument control commands stored in a signal measurement system instrument, comprising the steps of:
(a) storing, in the signal measurement instrument a macro text file comprising one or more text strings of which at least one is an instrument control command;
(b) processing said macro text file to form an executable macro file; and
(c) executing said executable macro file in response to activation of a macro control key on a control panel of the signal measurement instrument.

24. The method of claim 23, wherein said storing step (a) comprises the steps of:
(1) providing a text editor to provide a text file editing environment on a graphical user interface of the signal measurement instrument; and
(2) receiving operator inputs via the graphical user interface to develop or modify the macro text file.

25. The method of claim 23, wherein said step (b) comprises the steps of:
(1) removing bank lines from said macro text file;
(2) removing disallowed commands from said macro text file; and
(3) removing leading and trailing bank characters from said macro text file.

26. The method of claim 23, wherein said macro text file is one of a plurality of macro text files, and wherein said step (a) further comprises the step of:
retrieving a selected macro text file from said plurality of macro text files stored in memory in response to a macro selection, command.

27. The method of claim 24, wherein said text editor utilizes said graphical user interface to provide the operator with a display list of command names from which the operator can select a command string for inclusion into said macro text file, wherein selection of a command name causes said selected command string to be inserted into said macro file.

28. The method of claim 26, wherein said text strings further comprise one or more macro control commands for controlling execution of said macro file, and wherein said stop (c) comprises the steps of:
(1) executing said instrument control commands in accordance with said macro control commands to generate formatted commands; and
(2) converting said formatted commands to signal measurement instrument function calls.

29. The method of claim 28, wherein said step (c) further comprises the step of:
(3) generating of a display of said executable macro file with a visual indication of which text string of said executable macro file is currently being executed by execution unit.

* * * * *